(12) United States Patent
Fujimoto

(10) Patent No.: US 12,190,967 B2
(45) Date of Patent: Jan. 7, 2025

(54) VOLTAGE GENERATION CIRCUIT AND SEMICONDUCTOR MEMORY DEVICE

(71) Applicant: Kioxia Corporation, Tokyo (JP)

(72) Inventor: Takumi Fujimoto, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 191 days.

(21) Appl. No.: 17/901,512

(22) Filed: Sep. 1, 2022

(65) Prior Publication Data
US 2023/0307066 A1 Sep. 28, 2023

(30) Foreign Application Priority Data

Mar. 23, 2022 (JP) .................. 2022-047396

(51) Int. Cl.
| | |
|---|---|
| H02M 3/07 | (2006.01) |
| G11C 16/04 | (2006.01) |
| G11C 16/30 | (2006.01) |
| G11C 5/14 | (2006.01) |
| G11C 16/32 | (2006.01) |

(52) U.S. Cl.
CPC .............. G11C 16/30 (2013.01); H02M 3/07 (2013.01); *G11C 5/145* (2013.01); *G11C 16/0483* (2013.01); *G11C 16/32* (2013.01)

(58) Field of Classification Search
CPC ..... G11C 16/30; G11C 16/0483; G11C 16/32; G11C 5/145; H02M 3/07

USPC ...................................................... 365/185.18
See application file for complete search history.

(56) References Cited

U.S. PATENT DOCUMENTS

| | | | | |
|---|---|---|---|---|
| 5,959,854 | A * | 9/1999 | Okada .................... | G11C 5/145 363/60 |
| 6,816,001 | B2 * | 11/2004 | Khouri .................. | H02M 3/073 363/60 |
| 10,992,226 | B1 * | 4/2021 | Aboueldahab ........ | H02M 3/072 |
| 2005/0047181 | A1 | 3/2005 | Yamamoto et al. | |
| 2008/0068068 | A1 * | 3/2008 | Yadala .................. | H02M 3/073 327/536 |
| 2008/0084239 | A1 | 4/2008 | Oswald et al. | |
| 2012/0062291 | A1 * | 3/2012 | Saitoh ..................... | H04L 7/033 327/157 |
| 2015/0070080 | A1 * | 3/2015 | Taft ........................ | H02J 1/102 327/536 |
| 2015/0070081 | A1 * | 3/2015 | Taft ....................... | H02M 3/073 327/536 |
| 2020/0098398 | A1 | 3/2020 | Mohr et al. | |

FOREIGN PATENT DOCUMENTS

JP   4862023 B2   1/2012

* cited by examiner

*Primary Examiner* — Ly D Pham
(74) *Attorney, Agent, or Firm* — Foley & Lardner LLP

(57) ABSTRACT

A voltage generation circuit includes a plurality of charge pumps connected to a first node, and a control circuit that controls the number of active charge pumps among the plurality of charge pumps based on a period in which a voltage of the first node satisfies a condition.

14 Claims, 13 Drawing Sheets

VOLTAGE GENERATION CIRCUIT AND SEMICONDUCTOR MEMORY DEVICE

CROSS-REFERENCE TO RELATED APPLICATION

This application is based upon and claims the benefit of priority from Japanese Patent Application No. 2022-047396, filed Mar. 23, 2022, the entire contents of which are incorporated herein by reference.

FIELD

Embodiments described herein relate generally to a voltage generation circuit and a semiconductor memory device.

BACKGROUND

A NAND flash memory is known as a semiconductor memory device including memory cells for storing data in a non-volatile manner. A voltage generation circuit in a semiconductor memory device supplies voltages to various wires connected to the memory cells.

DETAILED DESCRIPTION

Figure 1:
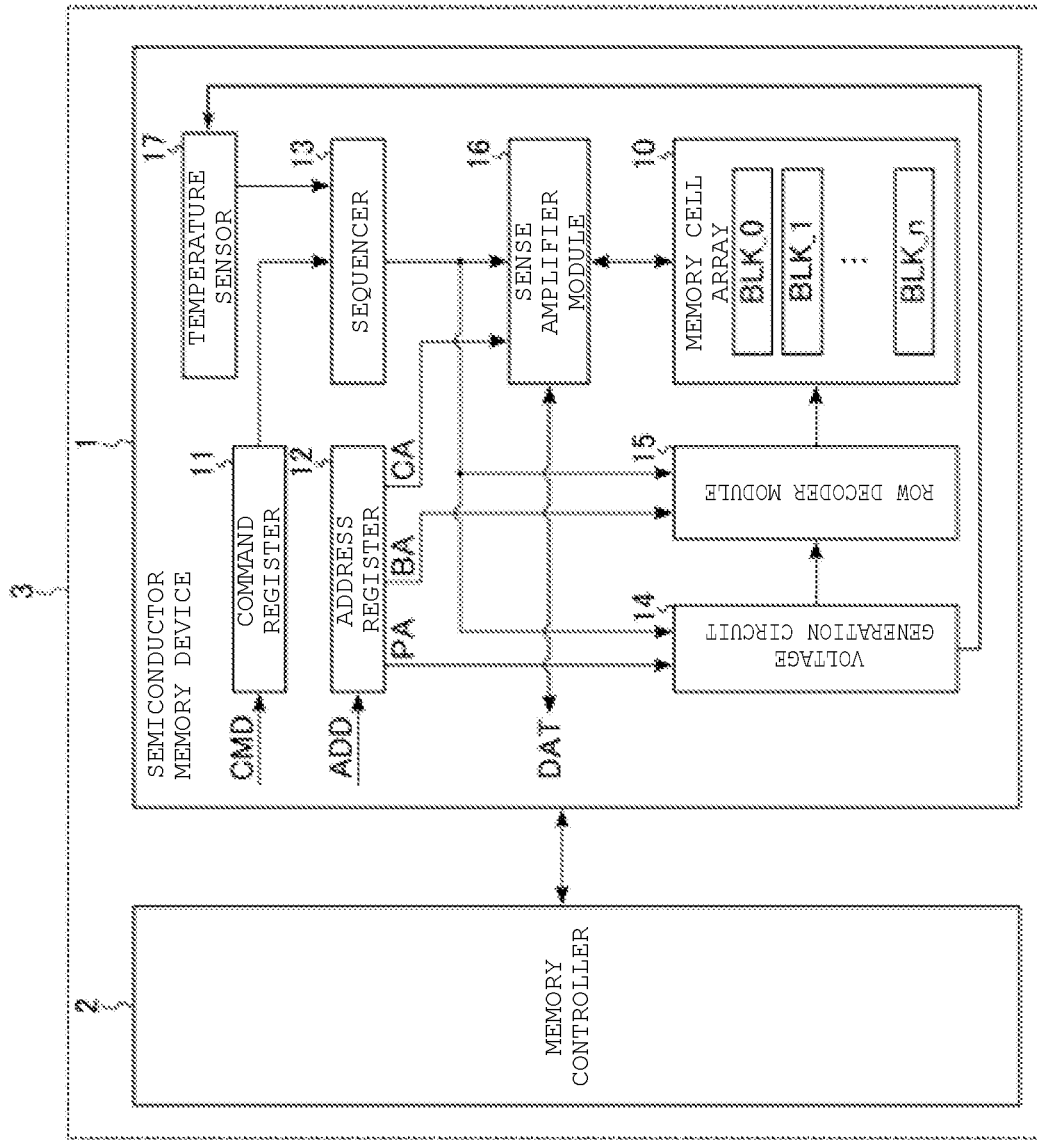
FIG. 1 is a block diagram illustrating an example of a configuration of a memory system including a semiconductor memory device according to at least one embodiment.

At least one embodiment provides a voltage generation circuit that prevents an increase in magnitude of fluctuation of an output voltage while preventing an increase in area and an increase in the amount of current consumption.

In general, according to at least one embodiment, a voltage generation circuit includes a plurality of charge pumps connected to a first node, and a control circuit that controls the number of active charge pumps among the plurality of charge pumps based on a period in which a voltage of the first node satisfies a condition.

Hereinafter, embodiments will be described with reference to the drawings. In the following description, components having the same function and configuration are designated by a common reference numeral.

1. Embodiment

1.1 Configuration

1.1.1 Memory System

A configuration of a memory system will be described with reference to FIG. 1. FIG. 1 is a block diagram illustrating an example of a configuration of a memory system including a semiconductor memory device according to at least one embodiment.

A memory system 3 is, for example, a memory card such as an SDTM card, a universal flash storage (UFS), or a solid state drive (SSD). The memory system 3 includes a semiconductor memory device 1 and a memory controller 2. The memory system 3 is configured to be connectable to an external host apparatus (not illustrated).

The memory controller 2 is composed of, for example, an integrated circuit such as a system-on-a-chip (SoC). The memory controller 2 controls the semiconductor memory device 1 based on a request from a host apparatus. Specifically, for example, the memory controller 2 writes data requested to be written by the host apparatus to the semiconductor memory device 1. Further, the memory controller 2 reads out data requested to be read from the host apparatus from the semiconductor memory device 1 and transmits the data to the host apparatus.

The semiconductor memory device 1 is, for example, a NAND flash memory. The semiconductor memory device 1 stores data in a non-volatile manner.

Communication between the semiconductor memory device 1 and the memory controller 2 conforms to, for example, an SDR (single data rate) interface, a toggle DDR (double data rate) interface, or an ONFI (Open NAND flash interface).

1.1.2 Semiconductor Memory Device

Subsequently, an internal configuration of the semiconductor memory device 1 will be described with reference to the block diagram illustrated in FIG. 1. The semiconductor memory device 1 includes, for example, a memory cell array 10, a command register 11, an address register 12, a sequencer 13, a voltage generation circuit 14, a row decoder module 15, a sense amplifier module 16, and a temperature sensor 17.

The memory cell array 10 includes a plurality of blocks BLK0 to BLKn (n is an integer greater than or equal to 1). The block BLK is a set including a plurality of memory cells capable of storing data in a non-volatile manner. The block BLK is used as, for example, a data erase unit. Further, the memory cell array 10 includes a plurality of bit lines and a plurality of word lines. One memory cell is associated with, for example, one bit line and one word line.

The command register 11 stores a command CMD received by the semiconductor memory device 1 from the memory controller 2. The command CMD includes, for example, a command for causing the sequencer 13 to perform a read operation, a write operation, an erase operation, and the like.

The address register 12 stores address information ADD received from the memory controller 2 by the semiconductor memory device 1. The address information ADD includes, for example, a page address PA, a block address BA, and a column address CA. For example, the page address PA, the block address BA, and the column address CA are respectively used to select word lines, the blocks BLK, and bit lines.

The sequencer 13 controls all operations of the entire semiconductor memory device 1. For example, the sequencer 13 controls operations of the voltage generation circuit 14, the row decoder module 15, the sense amplifier module 16, and the like based on the command CMD stored in the command register 11. Thereby, a read operation, a write operation, an erase operation, and the like are performed.

The voltage generation circuit 14 generates voltages used in the read operation, the write operation, the erase operation, and the like based on instructions from the sequencer 13. Then, the voltage generation circuit 14 applies a generated voltage to a signal line corresponding to a selected word line based on, for example, the page address PA stored in the address register 12. Further, the voltage generation circuit 14 generates, for example, a power supply voltage of the temperature sensor 17. Then, the voltage generation circuit 14 applies the generated voltage to the temperature sensor 17.

The row decoder module 15 selects one block BLK in a corresponding memory cell array 10 based on the block address BA stored in the address register 12. Then, the row decoder module 15 transmits, for example, the voltage applied to the signal line corresponding to the selected word line to the selected word line in the selected block BLK.

The sense amplifier module 16 transmits write data received from the memory controller 2 to the memory cell array 10 during a write operation. Further, the sense amplifier module 16 makes determination of data stored in the memory cell based on a voltage of a bit line during a read operation. The sense amplifier module 16 transmits a result of the determination to the memory controller 2 as read data DAT.

The temperature sensor 17 detects a temperature of the semiconductor memory device 1. The temperature sensor 17 generates temperature information based on the detected temperature. The temperature sensor 17 transmits the generated temperature information to the sequencer 13. The temperature information is used to instruct the sequencer 13 to correct a voltage generated by the voltage generation circuit 14, for example, during a write operation, a read operation, and an erase operation.

1.1.3 Circuit Configuration of Memory Cell Array

Figure 2:
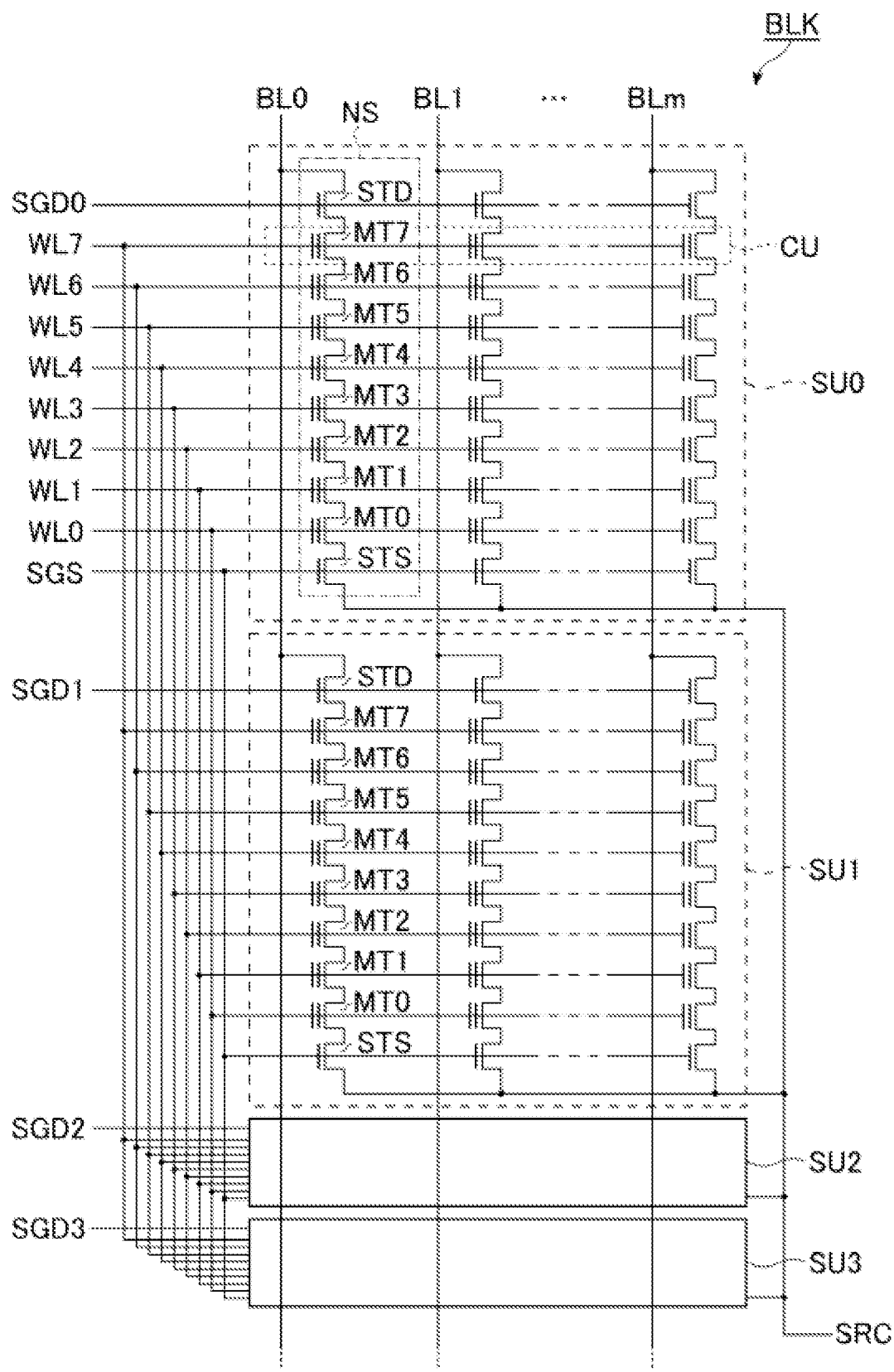
FIG. 2 is a circuit diagram illustrating an example of a configuration of a memory cell array of the semiconductor memory device according to at least one embodiment.

An example of a circuit configuration of the memory cell array 10 will be described with reference to FIG. 2. FIG. 2 is a circuit diagram illustrating an example of a circuit configuration of a memory cell array provided in a semiconductor memory device according to at least one embodiment. FIG. 2 illustrates one block BLK among a plurality of blocks BLK provided in the memory cell array 10. In the example illustrated in FIG. 2, the block BLK includes four string units SU0 to SU3.

Each string unit SU includes a plurality of NAND strings NS associated with bit lines BL0 to BLm (m is an integer greater than or equal to 1). Each NAND string NS includes, for example, memory cell transistors MT0 to MT7 and select transistors STD and STS. Each of the memory cell transistors MT0 to MT7 includes a control gate and a charge storage film. Each of the memory cell transistors MT0 to MT7 stores data in a non-volatile manner. The select transistors STD and STS are used to select the string unit SU during various operations. In the following description, when the bit lines BL0 to BLm are not distinguished from each other, each of the bit lines BL0 to BLm is simply referred to as a bit line BL. When the memory cell transistors MT0 to MT7 are not distinguished from each other, each of the memory cell transistors MT0 to MT7 is simply referred to as a memory cell transistor MT.

In each NAND string NS, the memory cell transistors MT0 to MT7 are connected to each other in series. A first terminal of the select transistor STD is connected to the bit line BL associated with the select transistor STD. A second terminal of the select transistor STD is connected to one end of one of the memory cell transistors MT0 to MT7 connected to each other in series. A first terminal of the select transistor STS is connected to one end of another one of the memory cell transistors MT0 to MT7 connected to each other in series. A second terminal of the select transistor STS is connected to a source line SRC.

In the same block BLK, control gates of the memory cell transistors MT0 to MT7 are respectively connected to the word lines WL0 to WL7. Gates of the select transistors STD in the string units SU0 to SU3 are respectively connected to the select gate lines SGD0 to SGD3. In contrast to this, gates of the plurality of select transistors STS are commonly connected to a select gate line SGS. However, the present disclosure is not limited thereto, and the gates of the plurality of select transistors STS may be connected to a plurality of select gate lines different for each string unit SU. In the following description, when the word lines WL0 to WL7 are not distinguished from each other, each of the word lines WL0 to WL7 is simply referred to as a word line WL.

Different column addresses are assigned to the bit lines BL0 to BLm. Each bit line BL is shared by the NAND string NS to which the same column address is assigned among the plurality of blocks BLK. The word lines WL0 to WL7 are provided to each block BLK. The source line SRC is shared, for example, between the plurality of blocks BLK.

A set including a plurality of memory cell transistors MT connected to a common word line WL in one string unit SU is referred to as, for example, a cell unit CU. For example, storage capacity of the cell unit CU including the plurality of memory cell transistors MT, each of which stores 1-bit data, is defined as "one-page data". The cell unit CU may have storage capacity of two-page data or more according to the number of bits of data stored in the memory cell transistor MT.

A circuit configuration of the memory cell array 10 is not limited to the configuration described above. For example, the number of string units SU provided in each block BLK may be freely designed. The number of memory cell transistors MT and the number of select transistors STD and STS provided in each NAND string NS may be freely designed.

1.1.4 Structure of Memory Cell Array

Figure 3:
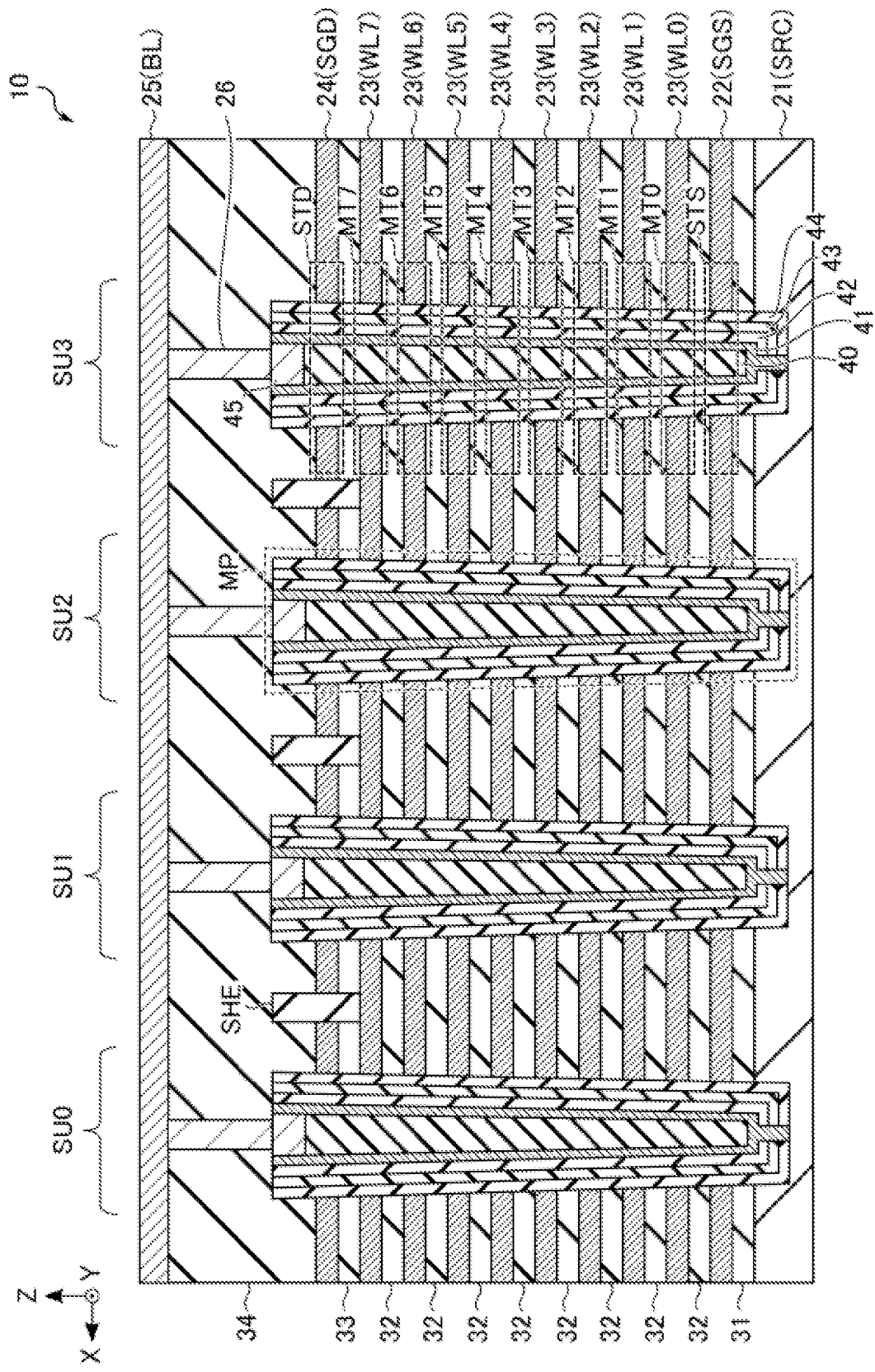
FIG. 3 is a cross-sectional view illustrating an example of a structure of the memory cell array of the semiconductor memory device according to at least one embodiment.

Next, a structure of the memory cell array 10 will be described with reference to FIG. 3. FIG. 3 is a cross-sectional view illustrating an example of a structure of a memory cell array of a semiconductor memory device according to at least one embodiment. In the drawings referred to below, the X direction corresponds to an extension direction of the bit line BL. The Y direction corresponds to an extension direction of the word line WL. The Z direction corresponds to a vertical direction with respect to a surface of a semiconductor substrate used to form the semiconductor memory device 1.

The memory cell array 10 includes conductor layers 21 to 26, insulator layers 31 to 34, and a plurality of memory pillars MP.

The conductor layer 21 is formed in, for example, a plate shape extending along an XY plane. The conductor layer 21 is used as the source line SRC. The conductor layer 21 is composed of a conductive material, and for example, an N-type semiconductor to which impurities are added, or a metal material is used therefor. Further, the conductor layer 21 may have a stack structure of, for example, a semiconductor and a metal.

The insulator layer 31 is stacked on an upper surface of the conductor layer 21. The conductor layer 22 is stacked on an upper surface of the insulator layer 31. The conductor layer 22 is formed in, for example, a plate shape extending along the XY plane. The conductor layer 22 is used as the select gate line SGS. The conductor layer 22 includes, for example, tungsten.

Eight insulator layers 32 and eight conductor layers 23 are alternately stacked in the order of the insulator layer 32, the conductor layer 23, the insulator layer 32, . . . , the insulator layer 32, and the conductor layer 23 on an upper surface of the conductor layer 22. The conductor layer 23 is formed in, for example, a plate shape extending along the XY plane. The plurality of stacked conductor layers 23 are used as the word lines WL0 to WL7 sequentially from the semiconductor substrate 20 side. The conductor layer 23 includes, for example, tungsten.

An insulator layer 33 is provided on an upper surface of the uppermost conductor layer 23. A conductor layer 24 is provided on an upper surface of the insulator layer 33. The conductor layer 24 is formed in, for example, a plate shape extending along the XY plane. The conductor layer 24 is used as the select gate line SGD. The conductor layer 24 includes, for example, tungsten.

The insulator layer 34 is provided on an upper surface of the conductor layer 24. A conductor layer 25 is provided on an upper surface of the insulator layer 34. The conductor layer 25 is formed in, for example, a line shape extending in the Y direction. The conductor layer 25 is used as the bit line BL. The conductor layer 25 includes, for example, copper.

Each memory pillar MP extends in the Z direction. Each memory pillar MP penetrates the insulator layers 31 and 33, the plurality of insulator layers 32, the conductor layers 22 and 24, and the plurality of conductor layers 23.

Each memory pillar MPs includes, for example, a core member 40, a semiconductor film 41, a tunnel insulating film 42, a charge storage film 43, a block insulating film 44, and a semiconductor portion 45.

The core member 40 extends in the Z direction. An upper end of the core member 40 is provided in, for example, a layer above the conductor layer 24. A lower end of the core member 40 is provided in, for example, a layer below the conductor layer 22. The core member 40 includes, for example, silicon oxide.

The semiconductor film 41 covers a side surface of the core member 40. An upper end of the semiconductor film 41 is located at a layer above an upper end of the core member 40. A lower end of the semiconductor film 41 covers a lower end of the core member 40 and is in contact with the conductor layer 21. The semiconductor film 41 includes, for example, polysilicon.

The tunnel insulating film 42 covers a side surface of the semiconductor film 41. The tunnel insulating film 42 includes, for example, silicon oxide.

The charge storage film 43 covers a side surface of the tunnel insulating film 42. The charge storage film 43 has a function of storing electric charges. The charge storage film 43 includes, for example, silicon nitride.

The block insulating film 44 covers a side surface of the charge storage film 43. The block insulating film 44 includes, for example, silicon oxide.

The semiconductor portion 45 covers an upper end of the core member 40. A side surface of the semiconductor portion 45 covers an inner wall portion of the semiconductor film 41 located at a layer above the upper end of the core member 40. An upper surface of the semiconductor portion 45 is in contact with the conductor layer 26. The conductor layer 26 is connected to the conductor layer 25, and the memory pillar MP and the conductor layer 25 are electrically connected to each other.

In a structure of the memory pillar MP described above, a portion where each memory pillar MP intersects the conductor layer 22 functions as the select transistor STS. A portion where each memory pillar MP intersects one conductor layer 23 functions as one memory cell transistor MT. A portion where each memory pillar MP intersects the conductor layer 24 functions as the select transistor STD. Further, the semiconductor film 41 functions as a current path of the memory cell transistors MT0 to MT7 and the select transistors STD and STS. In the semiconductor memory device 1, a current flows in the memory pillar MP between the bit line BL and the source line SRC by turning on the memory cell transistors MT0 to MT7 and the select transistors STD and STS.

1.1.5 Configuration of Voltage Generation Circuit

Figure 4:
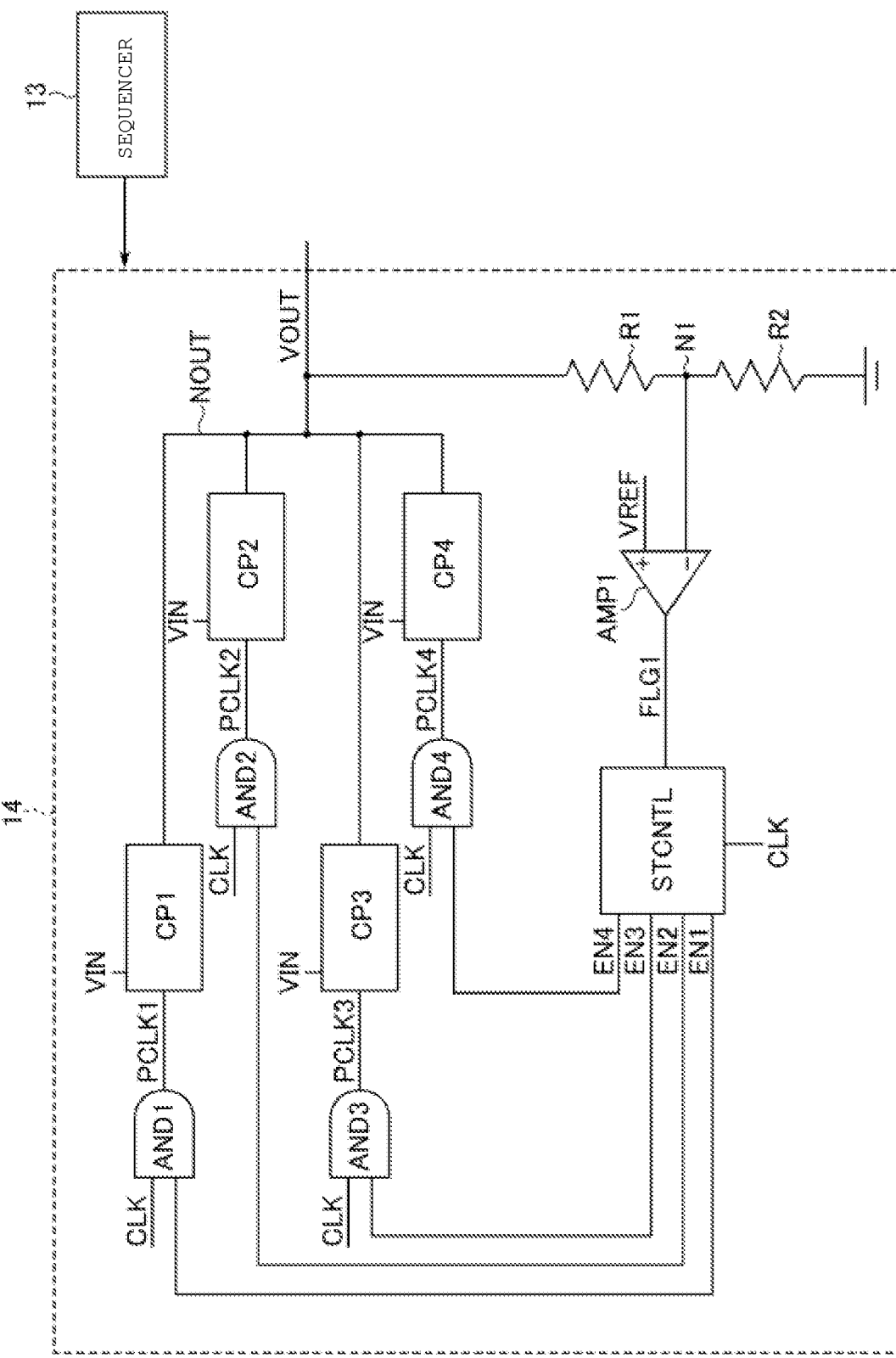
FIG. 4 is a circuit diagram illustrating an example of configurations of a voltage generation circuit and a sequencer according to at least one embodiment.

Next, a configuration of the voltage generation circuit 14 of the semiconductor memory device 1 according to the embodiment will be described with reference to FIG. 4. FIG. 4 is a circuit diagram illustrating an example of configurations of a voltage generation circuit and a sequencer according to the embodiment.

When a voltage VIN is input, the voltage generation circuit 14 outputs a voltage VOUT higher than the voltage VIN through the node NOUT from an output terminal in various operations. The voltage VIN is supplied from, for example, a voltage source (not illustrated) in the semiconductor memory device 1. The voltage VOUT is applied to various wires such as the word line WL and the source line SRC in operations such as a write operation, a read operation, and an erase operation. Further, the voltage VOUT may be applied to the temperature sensor 17 in the semiconductor memory device 1 in order to generate, for example, temperature information.

The voltage generation circuit 14 includes four charge pumps CP1, CP2, CP3, and CP4, logical product circuits (AND circuits) AND1, AND2, AND3, and AND4, an operational amplifier AMP1, resistors R1 and R2, and a state control circuit STCNTL.

The voltage VIN is input to a first terminal of the charge pump CP1. A signal PCLK1 is input to a second terminal of the charge pump CP1. A third terminal of the charge pump CP1 is connected to the node NOUT.

The voltage VIN is input to a first terminal of the charge pump CP2. A signal PCLK2 is input to a second terminal of the charge pump CP2. A third terminal of the charge pump CP2 is connected to the node NOUT.

The voltage VIN is input to a first terminal of the charge pump CP3. A signal PCLK3 is input to a second terminal of the charge pump CP3. A third terminal of the charge pump CP3 is connected to the node NOUT.

The voltage VIN is input to a first terminal of the charge pump CP4. A signal PCLK4 is input to a second terminal of the charge pump CP4. A third terminal of the charge pump CP4 is connected to the node NOUT.

In the following description, when the four charge pumps CP1, CP2, CP3, and CP4 are not distinguished from each other, each of the four charge pumps CP1, CP2, CP3, and CP4 is simply referred to as a charge pump CP. When the signals PCLK1, PCLK2, PCLK3, and PCLK4 are not distinguished from each other, each of the signals PCLK1, PCLK2, PCLK3, and PCLK4 is simply referred to as a signal PCLK.

While the clock signal is input as the signal PCLK and boost operations of all charge pumps CP are not collectively prohibited by the sequencer 13, each charge pump CP performs a boost operation. A case where the boost operations of all the charge pumps CP are collectively prohibited by the sequencer 13 is, for example, a case or the like where the output voltage VOUT exceeds a predetermined threshold voltage greater than a voltage VTARG1. A state of the charge pump CP to which a clock signal is input as the signal PCLK and which is designated as the charge pump CP capable of performing a boost operation by the state control circuit STCNTL is hereinafter referred to as active. Further, while no clock signal is input as the signal PCLK and an "L" level is maintained, the boost operation of each charge pump CP stops. A state of the charge pump CP to which a clock signal is not input as the signal PCLK and which is designated as the charge pump CP unable to perform the boost operation by the state control circuit STCNTL is hereinafter referred to as inactive. The inactive charge pump CP stops the boost operation even when the boost operation is not collectively prohibited by the sequencer 13. For example, a control circuit in the voltage generation circuit 14 (not illustrated), which is different from the sequencer 13, may collectively prohibit the boost operation in all the charge pumps CP.

A first terminal of the resistor R1 is connected to the node NOUT. A second terminal of the resistor R1 is connected to a node N1. A first terminal of the resistor R2 is connected to the node N1. A second terminal of the resistor R2 is grounded. That is, a voltage obtained by dividing the voltage VOUT based on a ratio of resistance values of the resistors R1 and R2 is supplied to the node N1 as a voltage VN1.

The operational amplifier AMP1 has a non-inverting input terminal (+), an inverting input terminal (−), and an output terminal. A voltage VREF is applied to the non-inverting input terminal (+) of the operational amplifier AMP1. The inverting input terminal (−) of the operational amplifier AMP1 is connected to the node N1. The operational amplifier AMP1 generates a signal FLG1 based on a comparison result of the voltage VREF applied to the non-inverting input terminal (+) and the voltage VN1 of the node N1 applied to the inverting input terminal (−). That is, the operational amplifier AMP1 generates the signal FLG1 of an "H (high)" level when the voltage VN1 is less than the voltage VREF. Further, the operational amplifier AMP1 generates the signal FLG1 of "L (low)" level when the voltage VN1 is higher than or equal to the voltage VREF. The voltage VREF is equal to the voltage VN1 of the node N1 when the voltage VOUT is equal to the voltage VTARG1. Thereby, when the voltage VOUT is less than the voltage VTARG1, the signal FLG1 of an "H" level is generated. Further, when the voltage VOUT is higher than or equal to the voltage VTARG1, the signal FLG1 of "L" level is generated. The generated signal FLG1 is output from an output terminal of the operational amplifier AMP1 to the state control circuit STCNTL.

The signal FLG1 output from the operational amplifier AMP1 is input to the state control circuit STCNTL. Further, a clock signal CLK is input to the state control circuit STCNTL. The state control circuit STCNTL calculates a period $N_{LCLK}$ in which the signal FLG1 input from the operational amplifier AMP1 is maintained at an "L" level, and a period $N_{HCLK}$ in which the signal FLG1 input from the operational amplifier AMP1 is maintained at an "H" level by using the input clock signal CLK. The state control circuit STCNTL generates signals EN1, EN2, EN3, and EN4, each of which is at an "H" level or an "L" level, based on the periods $N_{LCLK}$ and $N_{HCLK}$. In the following description, when the signals EN1 to EN4 are not distinguished from each other, each of the signals EN1 to EN4 is simply referred to as a signal EN. The state control circuit STCNTL controls the number Nu of signals EN at an "H" level among the signals EN1 to EN4 based on the periods $N_{LCLK}$ and $N_{HCLK}$. The control will be described below. The state control circuit STCNTL supplies the signals EN1, EN2, EN3, and EN4 respectively to the logical product circuits AND1, AND2, AND3, and AND4. The state control circuit STCNTL designates an active charge pump CP and an inactive charge pump CP by using the signal EN.

The logical product circuit AND1 has a first terminal, a second terminal, and a third terminal. The signal EN1 is input to the first terminal of the logical product circuit AND1. A clock signal CLK is input to the second terminal of the logical product circuit AND1. The logical product circuit AND1 performs a logical product operation of the signal EN1 and the clock signal CLK and generates the signal PCLK1. More specifically, the logical product circuit AND1 generates the signal PCLK1 having the same frequency as the clock signal CLK while the signal EN1 is at an "H" level. Further, the logical product circuit AND1 generates the signal PCLK1 of an "L" level while the signal EN1 is at an "L" level. The signal PCLK1 is output to the charge pump CP1 from a third terminal of the logical product circuit AND1.

The logical product circuit AND2 has a first terminal, a second terminal, and a third terminal. The signal EN2 is input to the first terminal of the logical product circuit AND2. The clock signal CLK is input to the second terminal of the logical product circuit AND2. The logical product circuit AND2 performs a logical product operation of the signal EN2 and the clock signal CLK and generates the signal PCLK2. More specifically, the logical product circuit AND2 generates the signal PCLK2 having the same frequency as the clock signal CLK while the signal EN2 is at an "H" level. Further, the logical product circuit AND2 generates the signal PCLK2 of an "L" level while the signal EN2 is at an "L" level. The signal PCLK2 is output to the charge pump CP2 from the third terminal of the logical product circuit AND2.

The logical product circuit AND3 has a first terminal, a second terminal, and a third terminal. The signal EN3 is input to the first terminal of the logical product circuit AND3. The clock signal CLK is input to the second terminal of the logical product circuit AND3. The logical product circuit AND3 performs a logical product operation of the signal EN3 and the clock signal CLK and generates the signal PCLK3. More specifically, the logical product circuit AND3 generates the signal PCLK3 having the same frequency as the clock signal CLK while the signal EN3 is at an "H" level. Further, the logical product circuit AND3 generates the signal PCLK3 of an "L" level while the signal EN3 is at an "L" level. The signal PCLK3 is output to the charge pump CP3 from the third terminal of the logical product circuit AND3.

The logical product circuit AND4 has a first terminal, a second terminal, and a third terminal. The signal EN4 is input to the first terminal of the logical product circuit AND4. The clock signal CLK is input to the second terminal of the logical product circuit AND4. The logical product circuit AND4 performs a logical product operation of the signal EN4 and the clock signal CLK and generates the signal PCLK4. More specifically, the logical product circuit AND4 generates the signal PCLK4 having the same frequency as the clock signal CLK while the signal EN4 is at an "H" level. Then, the signal PCLK4 is output to the charge pump CP4 from the third terminal of the logical product circuit AND4. Further, the logical product circuit AND4 generates the signal PCLK4 of an "L" level while the signal EN4 is at an "L" level. The signal PCLK4 is output to the charge pump CP4 from the third terminal of the logical product circuit AND4.

With the above configuration, while each signal EN is at an "H" level, a corresponding charge pump CP is active in a state where a boost operation is not collectively prohibited. Further, while each signal EN is maintained at an "L" level, a corresponding charge pump CP becomes inactive in a state where a boost operation is not collectively prohibited.

Among the signals EN1 to EN4 controlled by the state control circuit STCNTL described above, the voltage generation circuit 14 transitions between four states according to the number Nu of signals EN at an "H" level. Hereinafter, the four states are referred to as an "S1" state, an "S2" state, an "S3" state, and an "S4" state in ascending order of the corresponding number Nu.

The "S1" state is a state of the voltage generation circuit 14 in which one signal EN of the signals EN1 to EN4 has an "H" level. Further, three signals EN of the signals EN1 to EN4 are at an "L" level. Thereby, any one of the charge pumps CP1 to CP4 is active and the other three charge pumps CP are inactive in a state where a boost operation is not collectively prohibited.

The "S2" state is a state of the voltage generation circuit 14 in which two signals EN of the signals EN1 to EN4 are at an "H" level. Further, two signals EN of the signals EN1 to EN4 are at an "L" level. Thereby, any two charge pumps CP of the charge pumps CP1 to CP4 are active and the other two charge pumps CP are inactive in a state where a boost operation is not collectively prohibited.

The "S3" state is a state of the voltage generation circuit 14 in which three signals EN of the signals EN1 to EN4 are at an "H" level. Further, one signal EN of the signals EN1 to EN4 is at an "L" level. Thereby, any three charge pumps CP of the charge pumps CP1 to CP4 are active and the other one charge pump CP is inactive in a state where a boost operation is not collectively prohibited.

The "S4" state is a state of the voltage generation circuit 14 in which all signals EN are at an "H" level. Thereby, all charge pumps CP are active in a state where a boost operation is not collectively prohibited.

The sequencer 13 detects a height of the voltage VOUT with a configuration (not illustrated). The sequencer 13 controls the active charge pump CP based on the detected voltage VOUT in a state where a boost operation is not collectively prohibited. More specifically, when the sequencer 13 detects that the voltage VOUT is less than the voltage VTARG1, a state of the voltage generation circuit 14 is set to a state in which a boost operation is not collectively prohibited during a predetermined charge period. Then, the sequencer 13 causes the active charge pump CP to perform a boost operation. Further, after the charge period elapses, the sequencer 13 stops boost operations of all the charge pumps CP (a state of the voltage generation circuit 14 is set to a state in which the boost operations are collectively prohibited) during a discharge period until the voltage VOUT is detected to be lower than the voltage VTARG1. The sequencer 13 controls the voltage generation circuit 14 such that a boost operation of the active charge pump CP during the charge period and stop operations of all the charge pumps CP during a discharge period are repeatedly performed in this order.

With such a configuration, the sequencer 13 controls the voltage generation circuit 14 such that the voltage VOUT is higher than or substantially equal to the voltage VTARG1.

1.1.6 Configuration of Charge Pump

Figure 5:
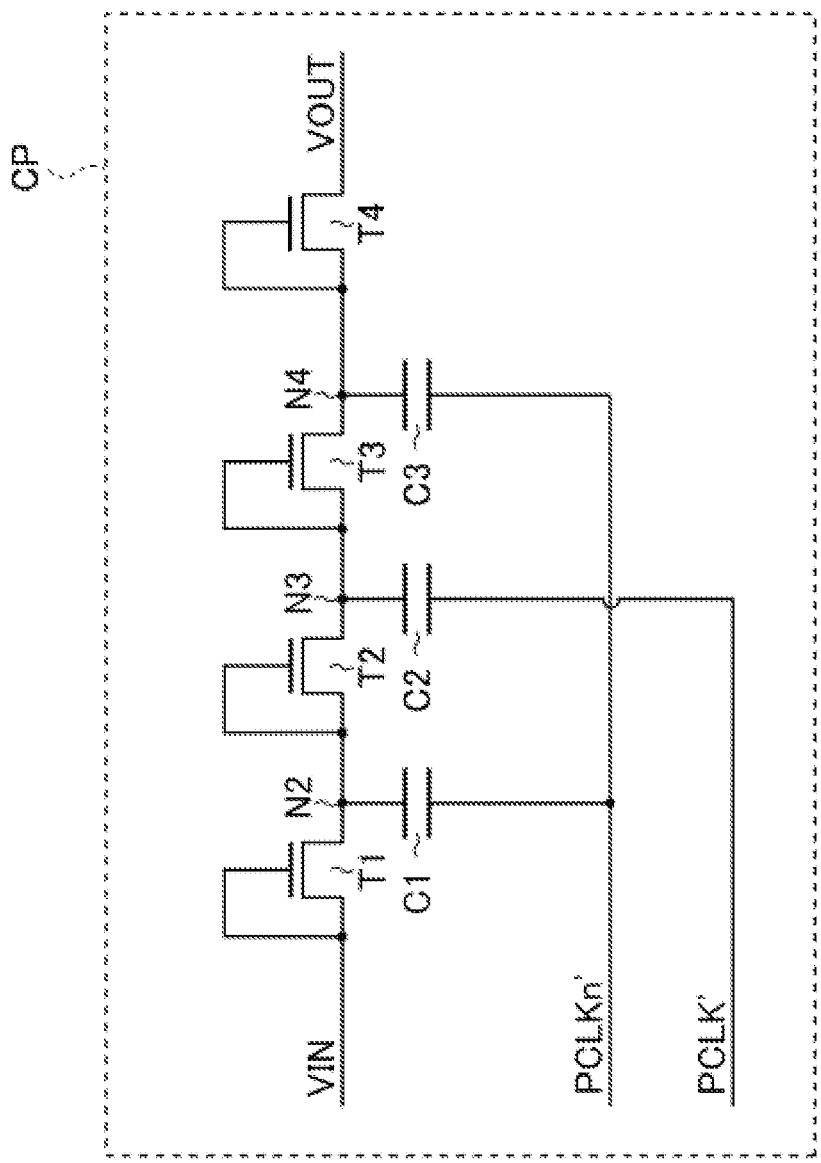
FIG. 5 is a circuit diagram illustrating an example of a configuration of a charge pump provided in the voltage generation circuit according to at least one embodiment.

A configuration example of the charge pump CP provided in the voltage generation circuit 14 will be described with reference to FIG. 5. FIG. 5 is a circuit diagram illustrating an example of a configuration of a charge pump provided in a voltage generation circuit according to an embodiment.

Each charge pump CP includes, for example, transistors T1, T2, T3, and T4 and capacitors C1, C2, and C3. In the following description, when the capacitors C1, C2, and C3 are not distinguished from each other, each of the capacitors C1, C2, and C3 is simply referred to as a capacitor C.

Each of the transistors T1 to T4 is, for example, an N-type transistor.

The voltage VIN is input to a first terminal and a gate of the transistor T1. A second terminal of the transistor T1 is connected to a node N2.

A first terminal and a gate of the transistor T2 are connected to the node N2. A second terminal of the transistor T2 is connected to a node N3.

A first terminal and a gate of the transistor T3 are connected to the node N3. A second terminal of the transistor T3 is connected to a node N4.

A first terminal and a gate of the transistor T4 are connected to the node N4. The voltage VOUT is output from a second terminal of the transistor T4.

A signal PCLK' and a signal PCLKn' which is an inverted signal thereof are input to each charge pump CP. The signals PCLK' and PCLKn' are generated by, for example, a driver (not illustrated) or the like provided in each charge pump CP by using the signal PCLK. The signal PCLK and a signal PCLKn which is an inverted signal thereof may be input to each charge pump CP instead of the signals PCLK' and PCLKn'.

A first terminal of the capacitor C1 is connected to the node N2. The signal PCLKn' is input to a second terminal of the capacitor C1.

A first terminal of the capacitor C2 is connected to the node N3. The signal PCLK' is input to a second terminal of the capacitor C2.

A first terminal of the capacitor C3 is connected to the node N4. The signal PCLKn' is input to a second terminal of the capacitor C3.

When the signal PCLK' is at an "H" level and the signal PCLKn' which is an inverted signal thereof goes to an "L" level, the transistors T1 and T3 are turned on, and the transistors T2 and T4 are turned off. Thereby, the first terminal of the transistor T1 is connected to the node N2, and the node N2 is disconnected from the node N3. Further, the node N3 is connected to the node N4, and the node N4 is disconnected from the second terminal of the transistor T4.

That is, when the signal PCLK' is at an "H" level and the signal PCLKn' which is an inverted signal thereof is at an "L" level, a voltage (approximately the voltage VIN) decreased from the voltage VIN due to influence of a threshold voltage Vth is transmitted to the node N2. A voltage (approximately a voltage (VC2+VD)) decreased from a voltage (the voltage (VC2+VD) as described below) of the node N3 due to influence of the threshold voltage Vth is transmitted to the node N4. VC2 is a voltage on both terminals of the charged capacitor C2. VD is a difference between a voltage of an "H" level of the signal PCLK' (or the signal PCLKn') and a voltage of an "L" level thereof.

While the signal PCLKn' is at an "L" level, the capacitor C1 is charged with the voltage VIN. Thereby, a voltage on both terminals of the capacitor C1 is VC1. Further, while the signal PCLKn' is at an "L" level, the capacitor C3 is charged with the voltage (VC2+VD) of the node N3. Thereby, a voltage on both terminals of the capacitor C3 is VC3.

Further, when the signal PCLK' is at an "H" level, a voltage of the node N3 changes the voltage VC1 on both terminals of the capacitor C1 into a voltage (VC1+VD) boosted by a difference VD between an "H" level and an "L" level of the signal PCLKn'. The voltage VC1 is a voltage decreased from the voltage VIN due to influence of the threshold voltage Vth, and assuming that the difference VD is equal to the voltage VIN, the voltage of the node N3 is approximately 2×VIN.

A voltage of the node N3 is maintained at approximately 2×VIN while the signal PCLK' is at an "H" level.

Thereafter, when the signal PCLK' is at an "L" level and the signal PCLKn' which is an inverted signal thereof is at an "H" level, the transistors T1 and T3 are turned off, and the transistors T2 and T4 are turned on. Thereby, the first terminal of the transistor T1 is disconnected from the node N2, and the node N2 is connected to the node N3. Further, the node N3 is disconnected from the node N4, and the node N4 is connected to the second terminal of the transistor T4.

That is, when the signal PCLK' is at an "L" level and the signal PCLKn' which is an inverted signal thereof is at an "H" level, a voltage of the node N2 changes the voltage VC1 on both terminals of the capacitor C1 into the voltage (VC1+VD) boosted by the difference VD between an "H" level and an "L" level of the signal PCLKn. The voltage of the node N2 is approximately 2×VIN.

Further, when the signal PCLKn' is at an "H" level, a voltage of the node N4 changes a voltage VC3 on both terminals of the capacitor C3 into a voltage (VC3+VD) boosted by the difference VD between an "H" level and an "L" level of the signal PCLKn'. The voltage of the node N4 is approximately 3×VIN.

While the signal PCLKn' is at an "H" level, the voltage of node N2 is maintained at approximately 3×VIN.

Further, when the signal PCLKn' is at an "H" level, approximately the voltage of the node N4 (approximately 3×VIN) is transmitted as the voltage VOUT.

When the signal PCLK' is at an "L" level, approximately the voltage of the node N2 (approximately 2×VIN) is transmitted to the node N3.

While the signal PCLK' is at an "L" level, the capacitor C2 is charged with a voltage of approximately 2×VIN. Thereby, a voltage on both terminals of the capacitor C2 is VC2.

As described above, when the signal PCLK' is at an "H" level, the voltage VIN is transmitted to the node N2, and a voltage of the node N3 (approximately 2×VIN) is transmitted to the node N4. The voltage of the node N3 is boosted by VD (VIN) to be approximately 2×VIN. Thereafter, when the signal PCLK is at an "L" level, a voltage of the node N2 is boosted by VD (VIN) to be approximately 2×VIN. A voltage of the node N4 is boosted by VD (VIN) to be approximately 3×VIN. The voltage of the node N2 (approximately 2×VIN) is transmitted to the node N3. Then, the voltage of the node N4 (approximately 3×VIN) is output as the voltage VOUT.

Further, the charge pump CP according to the embodiment includes the three capacitors C1 to C3, but the number of capacitors C provided in the charge pump CP according to the embodiment is not limited thereto. The number of capacitors C may be 2, 4, 5, or more and may be changed according to a target value or the like of a voltage to be boosted. In this case, for example, the signal PCLKn' is input to a second terminal of the capacitor C(2j−1) (j is a natural number). Further, for example, a signal PCLK' is input to a second terminal of the capacitor C(2j). The number of transistors is changed as appropriate according to the number of capacitors C.

Configurations of the charge pumps CP1 to CP4 are not limited to the example described with reference to FIG. 5. Each charge pump CP may be composed of, for example, a P-type transistor. Further, each charge pump CP may be a Vt cancel type charge pump composed of a transistor of which first terminal and gate are not equipotential, instead of, for example, a diode-connected transistor.

1.2 Operation

Next, an operation using the semiconductor memory device 1 according to the embodiment will be described.

In the following, it is described a first operation example in which the state control circuit STCNTL controls the number of active charge pumps CP to be reduced during a charge period, and a second operation in which the state control circuit STCNTL controls the number of active charge pumps CP to be increased during the charge period.

1.2.1 First Operation Example

State Transition of Voltage Generation Circuit

Figure 6:
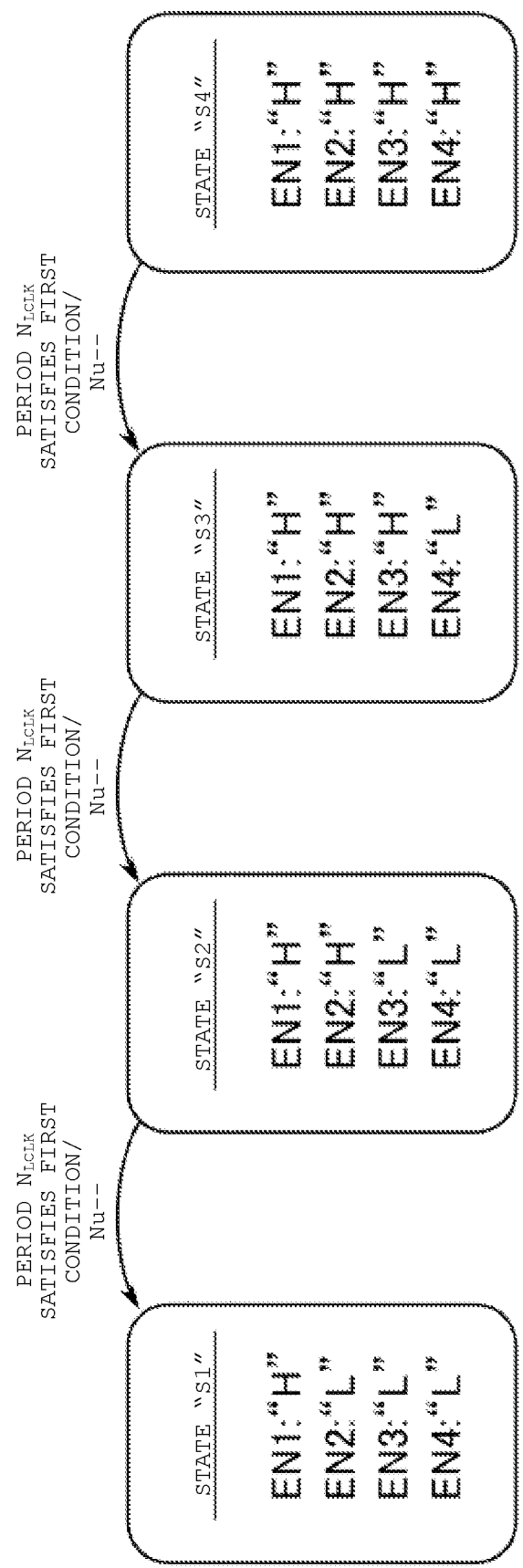
FIG. 6 is a state transition diagram illustrating an operation of a voltage generation circuit according to a first operation example of at least one embodiment.

A state transition of the voltage generation circuit 14 in a first operation example will be described with reference to FIG. 6. FIG. 6 is a state transition diagram illustrating an operation of the voltage generation circuit in the first operation example.

In the first operation example, when the period $N_{LCLK}$ in which the signal FLG1 is maintained at an "L" level satisfies a first condition, the state control circuit STCNTL decrements the number Nu of signals EN at an "H" level among the signals EN1 to EN4. Thereby, the state control circuit STCNTL transitions a state of the voltage generation circuit 14 so as to reduce the number of active charge pumps CP during the charge period.

More specifically, the state control circuit STCNTL calculates the period $N_{LCLK}$ in which the signal FLG1 is maintained at an "L" level, based on, for example, a clock cycle of the clock signal CLK. The state control circuit STCNTL calculates the period $N_{LCLK}$, based on, for example, a rising edge (a change from an "L" level to an "H" level) of the clock signal CLK and a falling edge (a change from an "H" level to an "L" level) thereof. The period $N_{LCLK}$ is, for example, ($N_1/2$) times a cycle of the clock signal CLK. Here, $N_1$ is a natural number. For example, the state control circuit STCNTL determines whether the calculated period $N_{LCLK}$ is twice or more the cycle of the clock signal CLK (whether the period $N_{LCLK}$ satisfies the first condition). When the period $N_{LCLK}$ is twice or more the cycle of the clock signal CLK, the state control circuit STCNTL decrements the number Nu of signals EN at an "H" level among the signals EN1 to EN4, based on a result of the determination. Further, when the period $N_{LCLK}$ is less than twice the cycle of the clock signal CLK, the state control circuit STCNTL maintains the number Nu of signals EN at an "H" level among the signals EN1 to EN4, based on the result of the determination.

More specifically, when the period $N_{LCLK}$ satisfies the first condition in the voltage generation circuit 14 having the "S4" state, the state control circuit STCNTL decrements (Nu−−) the number Nu of signals EN at an "H" level. Thereby, a state of the voltage generation circuit 14 transitions from the "S4" state to the "S3" state. In the following, it is assumed that the signals EN1 to EN3 are at an "H" level in the "S3" state. Further, it is assumed that the signal EN4 is at an "L" level.

When the period $N_{LCLK}$ satisfies the first condition in the voltage generation circuit 14 having the "S3" state, the state control circuit STCNTL decrements (Nu−−) the number Nu of signals EN at an "H" level. Thereby, the state of the voltage generation circuit 14 transitions from the "S3" state to the "S2" state. In the following, it is assumed that the signals EN1 and EN2 are at an "H" level in the "S2" state. Further, it is assumed that the signals EN3 and EN4 are at an "L" level.

When the period $N_{LCLK}$ satisfies the first condition in the voltage generation circuit 14 having the "S2" state, the state control circuit STCNTL decrements (Nu−−) the number Nu of signals EN at an "H" level. Thereby, the state of the voltage generation circuit 14 transitions from the "S2" state to the "S1" state. In the following, it is assumed that the signal EN1 is at an "H" level in the "S1" state. Further, it is assumed that the signals EN2 to EN4 are at an "L" level.

Timing Chart

Figure 7:
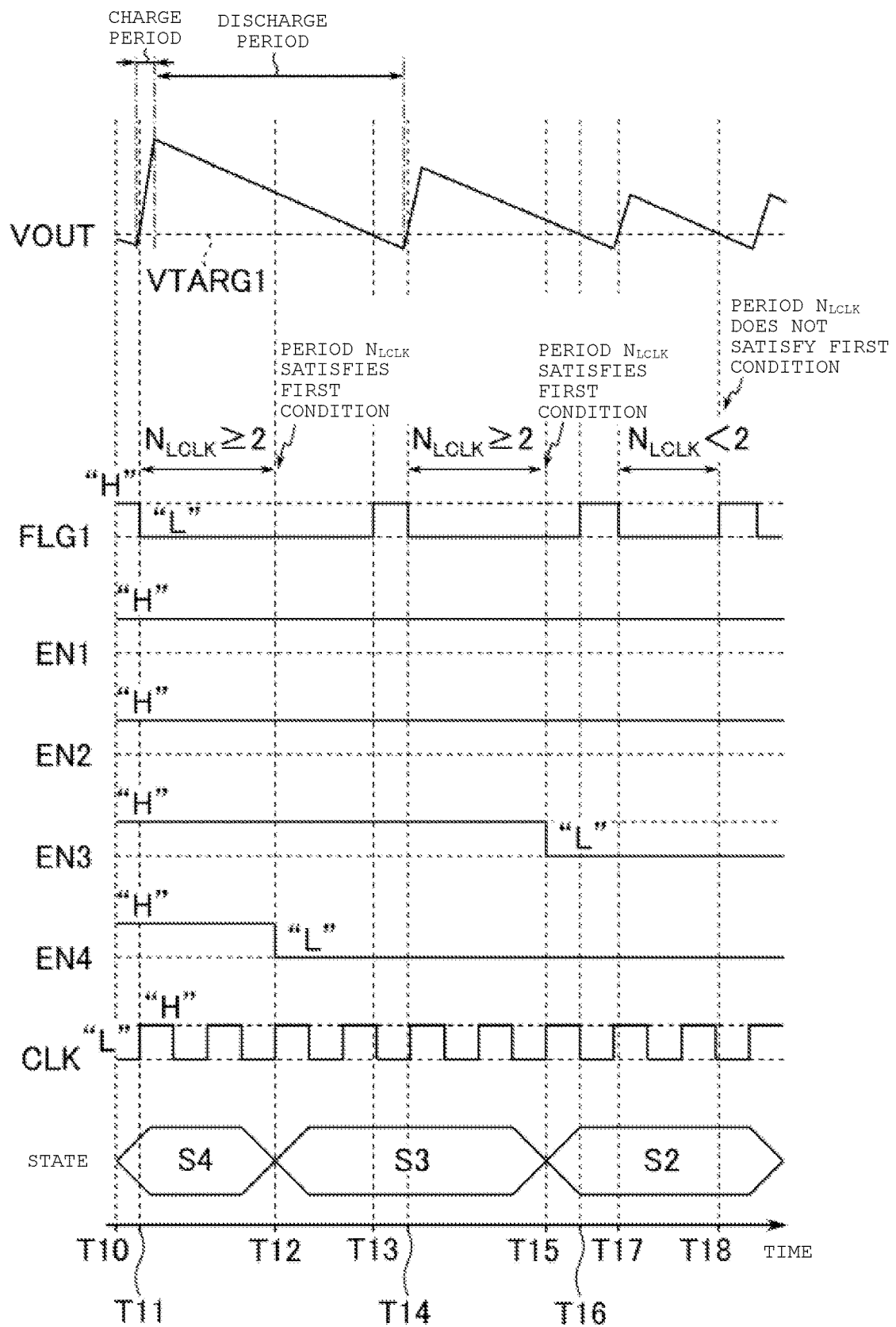
FIG. 7 is a timing chart illustrating the operation of the voltage generation circuit according to the first operation example of at least one embodiment.

An operation of the voltage generation circuit 14 in the first operation example will be further described with reference to FIG. 7. FIG. 7 is a timing chart illustrating the operation of the voltage generation circuit in the first operation example. FIG. 7 illustrates the voltage VOUT, the signals FLG1 and EN1 to EN4, the clock signal CLK, and states of the voltage generation circuit 14.

In the following, an example of an operation when the state of the voltage generation circuit 14 transitions from the "S4" state to the "S2" state is illustrated.

The state of the voltage generation circuit 14 at time T10 is the "S4" state. That is, the signals EN1 to EN4 are at an "H" level. Therefore, all the charge pumps CP are active during a charge period. Further, the voltage VOUT is less than the voltage VTARG1. Therefore, the signal FLG1 is at an "H" level.

Between time T10 and time T11, the sequencer 13 detects that the voltage VOUT is lower than the voltage VTARG1. Then, the sequencer 13 starts boost operations of all the charge pumps CP1 to CP4.

At the time T11, the voltage VOUT is higher than or equal to the voltage VTARG1 due to the boost operations of all the charge pumps CP1 to CP4. Therefore, the signal FLG1 changes from an "H" level to an "L" level.

After the time T11, the charge period ends and a discharge period starts. Along with this, the sequencer 13 stops the boost operations of all the charge pumps CP1 to CP4. Thereby, the voltage VOUT begins to decrease.

Further, between the time T11 and time T12, the voltage VOUT is maintained at a voltage higher than or equal to the voltage VTARG1. The time T12 is time when a period twice a cycle of the clock signal CLK has elapsed from the time T11. Thereby, the state control circuit STCNTL determines that the period $N_{LCLK}$ is twice or more the cycle of the clock signal CLK. That is, the period $N_{LCLK}$ satisfies the first condition. Therefore, the state control circuit STCNTL changes the signal EN4 from an "H" level to an "L" level based on a result of the determination. Further, the state control circuit STCNTL maintains the signals EN1 to EN3 at an "H" level. By these operations, the state control circuit STCNTL transitions the state of the voltage generation circuit 14 from the "S4" state to the "S3" state. Along with this, the charge pumps CP that are active during the charge period are the three charge pumps CP1 to CP3.

At time T13, the voltage VOUT is lower than the voltage VTARG1 because a boost operation stops. Thereby, the signal FLG1 changes from an "L" level to an "H" level.

Between the time T13 and time T14, the sequencer 13 detects that the voltage VOUT is lower than the voltage VTARG1. Thereby, the discharge period ends. Further, the sequencer 13 starts boost operations of the charge pumps CP1 to CP3.

At the time T14, the voltage VOUT is higher than or equal to the voltage VTARG1 due to the boost operations of the charge pumps CP1 to CP3. Therefore, the signal FLG1 changes from an "H" level to an "L" level.

After the time T14, the charge period ends and the discharge period starts. Along with this, the sequencer 13 stops the boost operations of the charge pumps CP1 to CP3. Thereby, the voltage VOUT begins to decrease.

Further, between the time T14 and time T15, the voltage VOUT is maintained at a voltage higher than or equal to the voltage VTARG1. The time T15 is time when twice the cycle of the clock signal CLK has elapsed from the time T14. Thereby, at the time T15, the state control circuit STCNTL determines that the period $N_{LCLK}$ is twice or more the cycle of the clock signal CLK. That is, the period $N_{LCLK}$ satisfies the first condition. Therefore, the state control circuit STCNTL changes the signal EN3 from an "H" level to an "L" level based on a result of the determination. Further, the state control circuit STCNTL maintains the signals EN1 and EN2 at an "H" level. Further, the state control circuit STCNTL maintains the signal EN4 at an "L" level. By this operation, the state control circuit STCNTL transitions the state of the voltage generation circuit 14 from the "S3" state to the "S2" state. Along with this, the charge pumps CP that are active during the charge period are two charge pumps CP1 and CP2.

At time T16, the voltage VOUT is lower than the voltage VTARG1 because a boost operation stops. Thereby, the signal FLG1 changes from an "L" level to an "H" level.

Between the time T16 and time T17, the sequencer 13 detects that the voltage VOUT is lower than the voltage VTARG1. Thereby, the discharge period ends. Further, the sequencer 13 starts boost operations of the charge pumps CP1 and CP2.

At the time T17, the voltage VOUT is higher than or equal to the voltage VTARG1 due to the boost operations of the charge pumps CP1 and CP2. Therefore, the signal FLG1 changes from an "H" level to an "L" level.

After the time T17, the charge period ends and the discharge period starts. Along with this, the sequencer 13 stops the boost operations of the charge pumps CP1 and CP2. Thereby, the voltage VOUT begins to decrease.

At time T18, the voltage VOUT is lower than the voltage VTARG1 because a boost operation stops. Thereby, the signal FLG1 changes from an "L" level to an "H" level. Here, the period $N_{LCLK}$ calculated at the time T18 is less than twice the cycle of the clock signal CLK. That is, the period $N_{LCLK}$ does not satisfy the first condition. Therefore, the state of the voltage generation circuit 14 is maintained in the "S2" state. Therefore, at time after the time T18, the sequencer 13 continuously starts the boost operations of the charge pumps CP1 and CP2.

As described above, the operation of the voltage generation circuit 14 is performed.

1.2.2 Second Operation Example

State Transition Diagram

Figure 8:
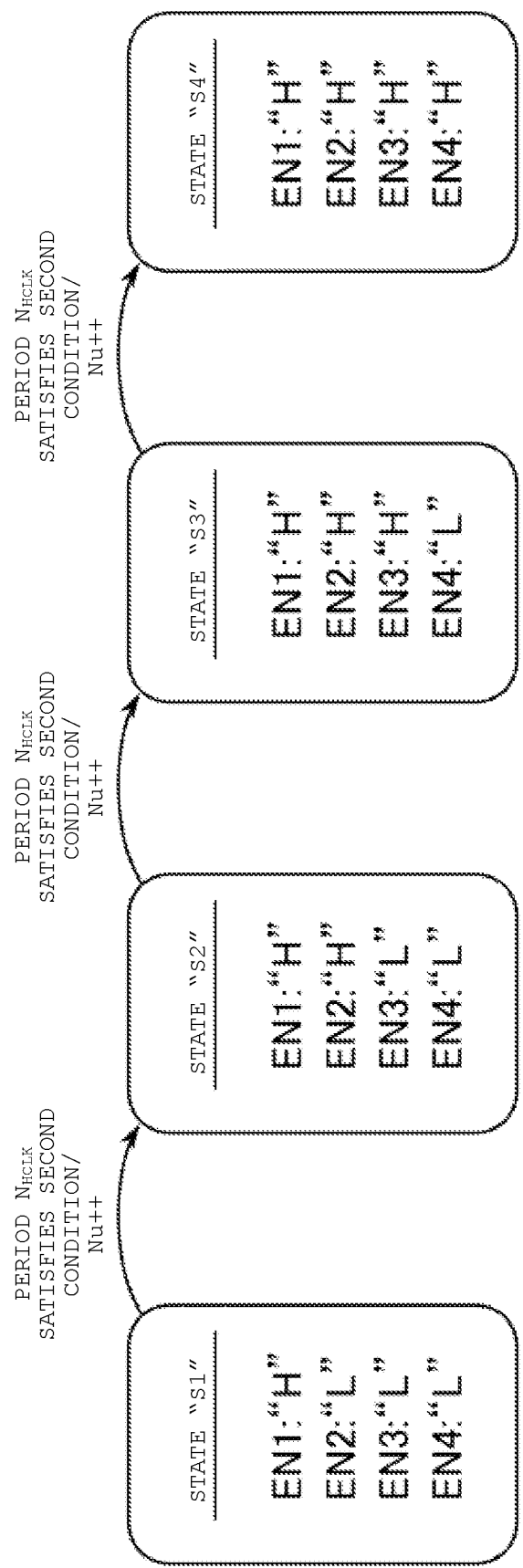
FIG. 8 is a state transition diagram illustrating an operation of a voltage generation circuit according to a second operation example of at least one embodiment.

Next, a state transition of the voltage generation circuit 14 in a second operation example will be described with reference to FIG. 8. FIG. 8 is a state transition diagram illustrating an operation of the voltage generation circuit in the second operation example. Control of the number Nu of signals EN based on the period $N_{LCLK}$ in the second operation example is the same as the control of the number Nu of signals EN based on the period $N_{LCLK}$ in the first operation example. Therefore, in FIG. 8, the control of the number Nu of signals EN based on the period $N_{LCLK}$ is omitted. Further, in the following, control of the number Nu of signals EN based on the period $N_{HCLK}$ will be mainly described.

In the second operation example, when the period $N_{HCLK}$ in which the signal FLG1 is maintained at an "H" level satisfies a second condition, the state control circuit STCNTL increments the number Nu of signals EN at an "H" level among the signals EN1 to EN4. Thereby, the state control circuit STCNTL transitions the state of the voltage generation circuit 14 so as to increase the number of active charge pumps CP during a charge period.

More specifically, the state control circuit STCNTL calculates the period $N_{HCLK}$ in which the signal FLG1 is maintained at an "H" level, based on, for example, a clock cycle of the clock signal CLK. The state control circuit STCNTL calculates the period $N_{HCLK}$ based on, for example, a rising edge and a falling edge of the clock signal CLK. The period $N_{HCLK}$ is, for example, a ($N_2/2$) cycle of the clock signal CLK. Here, $N_2$ is a natural number. For example, the state control circuit STCNTL determines whether the calculated period $N_{HCLK}$ is twice or more the cycle of the clock signal CLK (whether the period $N_{HCLK}$ satisfies the second condition). When the period $N_{HCLK}$ is twice or more the cycle of the clock signal CLK, the state control circuit STCNTL increments the number Nu of signals EN at an "H" level among the signals EN1 to EN4, based on a result of the determination. Further, when the period $N_{HCLK}$ is less than twice the cycle of the clock signal CLK, the state control circuit STCNTL maintains the number Nu of signals EN at an "H" level among the signals EN1 to EN4, based on the result of the determination.

When the period $N_{HCLK}$ satisfies the second condition in the voltage generation circuit 14 having the "S1" state, the state control circuit STCNTL increments (Nu++) the number Nu of signals EN at an "H" level. Thereby, a state of the voltage generation circuit 14 transitions from the "S1" state to the "S2" state.

When the period $N_{HCLK}$ satisfies the second condition in the voltage generation circuit 14 having the "S2" state, the state control circuit STCNTL increments (Nu++) the number Nu of signals EN at an "H" level. Thereby, the state of the voltage generation circuit 14 transitions from the "S2" state to the "S3" state.

When the period $N_{HCLK}$ satisfies the second condition in the voltage generation circuit 14 having the "S3" state, the state control circuit STCNTL increments (Nu++) the number Nu of signals EN at an "H" level. Thereby, the state of the voltage generation circuit 14 transitions from the "S3" state to the "S4" state.

Timing Chart

Figure 9:
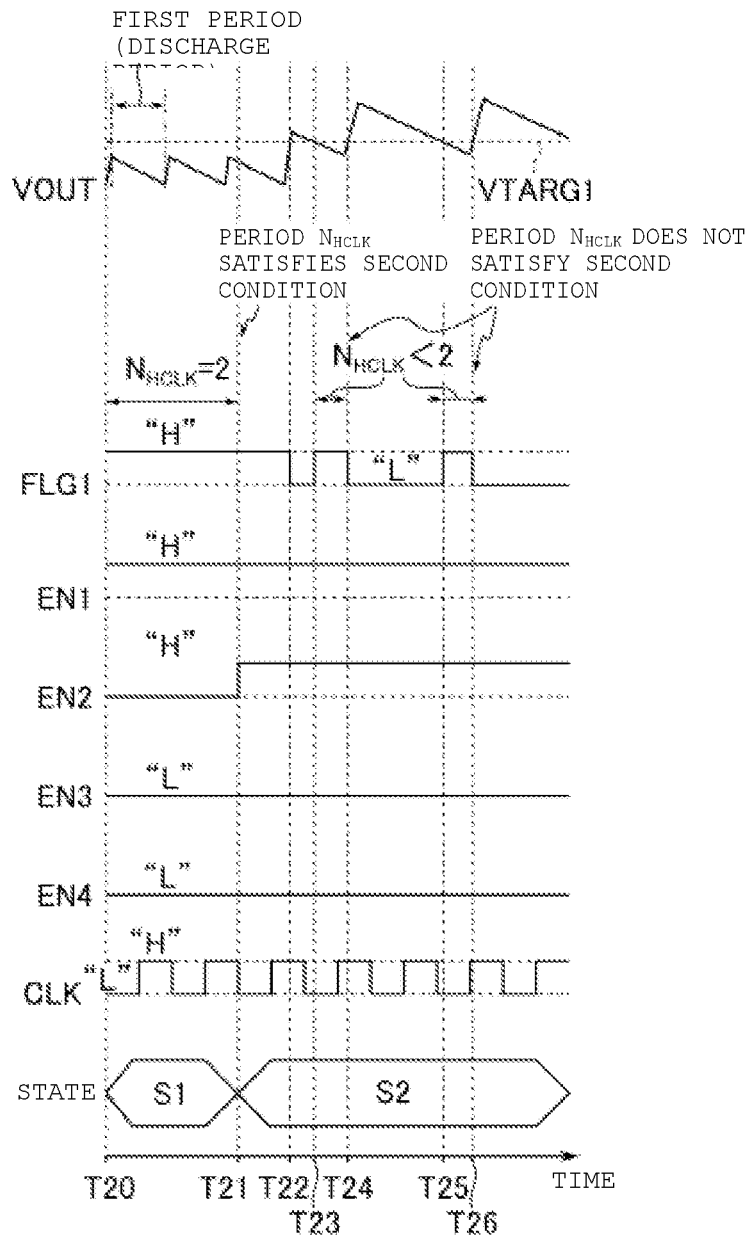
FIG. 9 is a timing chart illustrating the operation of the voltage generation circuit according to the second operation example of at least one embodiment.

An operation of the voltage generation circuit 14 in the second operation example will be further described with reference to FIG. 9. FIG. 9 is a timing chart illustrating the operation of the voltage generation circuit in the second operation example. FIG. 9 illustrates the voltage VOUT, the signals FLG1 and EN1 to EN4, the clock signal CLK, and states of the voltage generation circuit 14.

In the following, an example of an operation when the state of the voltage generation circuit 14 transitions from the "S1" state to the "S2" state is illustrated.

In the second operation example, the sequencer 13 sets a period of at least a first period or longer as a discharge period. For example, when the voltage VOUT is lower than the voltage VTARG1 before the first period elapses from end time of a charge period, the sequencer 13 sets the first period as the discharge period. In this case, the next charge period starts at the time when the first period elapses from the end time of the charge period.

A state of the voltage generation circuit 14 at time T20 is the "S1" state. That is, the signal EN1 is at an "H" level. Further, the signals EN2 to EN4 are at an "L" level.

At the time T20, the voltage VOUT is lower than the voltage VTARG1. Thereby, the sequencer 13 starts a boost operation of the charge pump CP1 that is active during the charge period. Then, the discharge period starts at the end of the charge period. The voltage VOUT at the end time of the charge period is lower than the voltage VTARG1. Then, the sequencer 13 stops the boost operation of the charge pump CP1. Thereby, the voltage VOUT begins to decrease. At the time when the first period elapses, the voltage VOUT decreases to a voltage equal to the voltage VOUT, for example, at the start time of the charge period of the charge pump CP1. Therefore, until the state of the voltage generation circuit 14 transitions, the boost operation of the charge pump CP1 that is active during the charge period and the boost operations of all the charge pumps CP1 to CP4 during the first period are repeatedly stopped.

Between the time T20 and time T21, the voltage VOUT is maintained to be lower than the voltage VTARG1. The time T21 is time when a period of twice or more the cycle of the clock signal CLK elapsed from the time T20. Thereby, at the time T21, the state control circuit STCNTL determines that the period $N_{HCLK}$ is two or more cycles of the clock signal CLK. That is, the period $N_{HCLK}$ satisfies the second condition. Therefore, the state control circuit STCNTL changes the signal EN2 from an "L" level to an "H" level based on a result of the determination. Further, the state control circuit STCNTL maintains the signal EN1 at an "H" level. Further, the state control circuit STCNTL maintains the signals EN3 and EN4 at an "L" level. Thereby, the state control circuit STCNTL transitions the state of the voltage generation circuit 14 from the "S1" state to the "S2" state. Along with this, the charge pumps CP that are active during the charge period are two charge pumps CP1 and CP2.

Between the time T21 and time T22, the sequencer 13 detects that the voltage VOUT is lower than the voltage VTARG1. Then, boost operations of the charge pumps CP1 and CP2 start according to the control of the sequencer 13.

At the time T22, the voltage VOUT increases to be higher than or equal to the voltage VTARG1 due to the boost operations of the charge pumps CP1 and CP2. Therefore, the signal FLG1 changes from an "H" level to an "L" level.

After the time T22, the charge period ends and a discharge period starts. Along with this, the sequencer 13 stops the boost operations of the charge pumps CP1 and CP2. Thereby, the voltage VOUT begins to decrease.

At time T23, the voltage VOUT is lower than the voltage VTARG1 because a boost operation stops. Thereby, the signal FLG1 changes from an "L" level to an "H" level.

The discharge period ends between the time T23 and time T24. Then, the sequencer 13 detects that the voltage VOUT is lower than the voltage VTARG1. Thereby, the sequencer 13 starts the boost operations of the charge pumps CP1 and CP2.

At the time T24, the voltage VOUT is higher than or equal to the voltage VTARG1 due to the boost operations of the charge pumps CP1 and CP2. Therefore, the signal FLG1 changes from an "H" level to an "L" level. Here, the period $N_{HCLK}$ calculated at the time T24 is less than two cycles of the clock signal CLK. That is, the period $N_{HCLK}$ does not satisfy the second condition. Therefore, the state control circuit STCNTL maintains the state of the voltage generation circuit 14 in the "S2" state.

Between the time T24 and time T25, the charge period ends and the discharge period starts. Thereby, the voltage VOUT begins to decrease.

At the time T25, the voltage VOUT is lower than the voltage VTARG1 because a boost operation stops. Thereby, the signal FLG1 changes from an "L" level to an "H" level.

The discharge period ends between the time T25 and time T26. Then, the sequencer 13 detects that the voltage VOUT is less than the voltage VTARG1. Thereby, the sequencer 13 starts the boost operations of the charge pumps CP1 and CP2 that are active during the charge period.

At the time T26, the voltage VOUT is higher than or equal to the voltage VTARG1 due to the boost operations of the charge pumps CP1 and CP2. Therefore, the signal FLG1 changes from an "H" level to an "L" level. Here, the period $N_{HCLK}$ calculated at the time T26 is less than two cycles of the clock signal CLK. That is, the period $N_{HCLK}$ does not satisfy the second condition. Therefore, the state control circuit STCNTL maintains the state of the voltage generation circuit 14 in the "S2" state.

As described above, the operation of the voltage generation circuit 14 is performed.

1.3 Effect

According to an embodiment, it is possible to prevent an increase in magnitude of fluctuation of an output voltage of a voltage generation circuit while an increase in area of the voltage generation circuit is prevented and an increase in the amount of current consumption is prevented. Effects of the embodiments will be described below. Fluctuation of an output voltage is a variation of an output voltage caused by an increase in the output voltage during a charge period and a decrease in the output voltage during a discharge period. In the following description, the fluctuation of the output voltage is called ripple.

The voltage generation circuit 14 includes the charge pumps CP1 to CP4, each of which has an input terminal and an output terminal connected to the node NOUT, and the state control circuit STCNTL configured to be able to control the charge pumps CP1 to CP4. The state control circuit STCNTL calculates the period $N_{LCLK}$ in which the signal FLG1 based on the voltage VOUT is at an "L" level during an operation of outputting the voltage VOUT. The state control circuit STCNTL controls the number of charge pumps CP that are active during a charge period by using the calculated period $N_{LCLK}$ and the period $N_{HCLK}$. With such a configuration, it is possible to prevent an increase in area of the voltage generation circuit 14 and an increase in the amount of current consumption, while preventing an increase in magnitude of ripple of an output voltage of the voltage generation circuit 14.

It is noted that it is desirable to reduce a magnitude of a ripple of an output voltage of a voltage generation circuit in order to prevent, for example, a defective operation and an abnormal operation in a semiconductor memory device. When the magnitude of the ripple of the output voltage increases, a voltage of a selected word line is unstable in various operations such as a write operation, a read operation, and an erase operation of the semiconductor memory device, and thus, there is a possibility that the defective operation and the abnormal operation are performed. Further, for example, when the magnitude of the ripple of the output voltage increases, a power supply voltage of a temperature sensor of the semiconductor memory device is unstable, and thus, there is a possibility that temperature information generated by the temperature sensor is inaccurate. Thereby, there is a possibility that a sequencer gives an erroneous instruction when the output voltage is corrected based on the temperature information.

In order to prevent an increase in the magnitude of the ripple of the output voltage, a configuration may be adopted in which the number of active charge pumps is controlled during a charge period based on a height of the output voltage. However, in this case, there is a possibility that a voltage division circuit, an operational amplifier, and the like in the voltage generation circuit increases in configuration for determining a voltage range including the output voltage. More specifically, the voltage generation circuit compares, for example, each of a plurality of voltages proportional to the output voltage generated by the voltage division circuit with a corresponding reference voltage by using a plurality of operational amplifiers. A state control circuit determines the voltage range including the output voltage based on the comparison result. Then, the state control circuit controls a state of the voltage generation circuit based on the determination result. However, in this case, there is a possibility that, as the number of charge pumps and the number of states of the voltage generation circuit increase, the configuration for determining the voltage range including the output voltage may increase. Therefore, it is difficult to prevent an increase in area of the voltage generation circuit and an increase in current consumption.

According to at least one embodiment, the state control circuit STCNTL provided in the voltage generation circuit 14 changes the number of charge pumps CP that performs a boost operation, based on periods $N_{LCLK}$ and $N_{HCLK}$ in which the signal FLG1 based on the voltage VOUT is at an "L" level. Thereby, it is possible to control a plurality of "S1" states to "S4" states of the voltage generation circuit 14 without increasing a configuration provided in a voltage division circuit and the number of operational amplifiers. Therefore, it is possible to prevent an increase in area of the voltage generation circuit and an increase in amount of current consumption.

Further, according to at least one embodiment, it is possible to prevent an increase in magnitude of a ripple of the voltage VOUT. More specifically, as illustrated in the first operation example, the state control circuit STCNTL determines that the number of charge pumps CP that are active during a charge period is large with respect to a load current of a load to which the voltage VOUT is applied when the period $N_{LCLK}$ is twice or more the cycle of the clock signal CLK. Here, the load is, for example, a signal line corresponding to the selected word line WL and the temperature sensor 17. Then, when it is determined that the number of charge pumps CP that are active during the charge period is large, the state control circuit STCNTL reduces the number of charge pumps CP that are active during the charge period. Thereby, the amount of increase in the voltage VOUT during the charge period is reduced. In the first operation example, the state control circuit STCNTL reduces the number of charge pumps CP that are active during the charge period until the period $N_{LCLK}$ is less than twice the cycle of the clock signal CLK. As such, by reducing the amount of increase in the voltage VOUT during the charge period, an increase in magnitude of a ripple of the voltage VOUT can be prevented. With such a configuration, the voltage generation circuit 14 of an embodiment adjusts the number of charge pumps CP of which boost operation is performed according to the load current by using the period $N_{LCLK}$ based on the voltage VOUT, and thus, an increase in magnitude of a ripple can be prevented. Further, the semiconductor memory device 1 including the voltage generation circuit 14 can prevent a decrease in reliability.

Further, as illustrated in the second operation example, the state control circuit STCNTL may control the voltage VOUT to be higher than or substantially equal to the voltage VTARG1 by increasing the number of charge pumps CP. More specifically, the state control circuit STCNTL determines that the number of charge pumps CP that are active during a charge period is small with respect to a load current of a load to which the voltage VOUT is applied when the period $N_{HCLK}$ is twice or more the cycle of the clock signal CLK. Then, when it is determined that the number of charge pumps CP that are active during the charge period is small, the state control circuit STCNTL increases the number of charge pumps CP that are active during the charge period. Thereby, the amount of increase in the voltage VOUT during the charge period is increased. The state control circuit STCNTL increases the number of charge pumps CP that are active during the charge period until the period $N_{HCLK}$ is less than twice the cycle of the clock signal CLK. As such, by increasing the amount of increase in the voltage VOUT during the charge period, the voltage VOUT can be set to a voltage higher than or substantially equal to the voltage VTARG1.

2. Modification Example

The above-described embodiment may be modified in various ways.

A semiconductor memory device according to a modification example will be described below. Hereinafter, a configuration of the semiconductor memory device according to the modification example will be described by focusing on differences from the semiconductor memory device according to at least one embodiment. The semiconductor memory device according to the modification example also has the same effect as in at least one embodiment.

2.1 First Modification Example

The above-described embodiment describes a case where the state control circuit STCNTL controls a state of the voltage generation circuit 14 by using the signal FLG1 is illustrated but is not limited thereto. The state control circuit STCNTL may control the state of the voltage generation circuit 14 based on a voltage different from the voltage VN1 in addition to the signal FLG1 based on the voltage VN1.

A semiconductor memory device according to a first modification example will be described below. Hereinafter, a configuration and an operation of the semiconductor memory device according to the first modification example will be described by focusing on differences from the configuration and operation of the semiconductor memory device according to at least one embodiment.

2.1.1 Configuration of Voltage Generation Circuit

Figure 10:
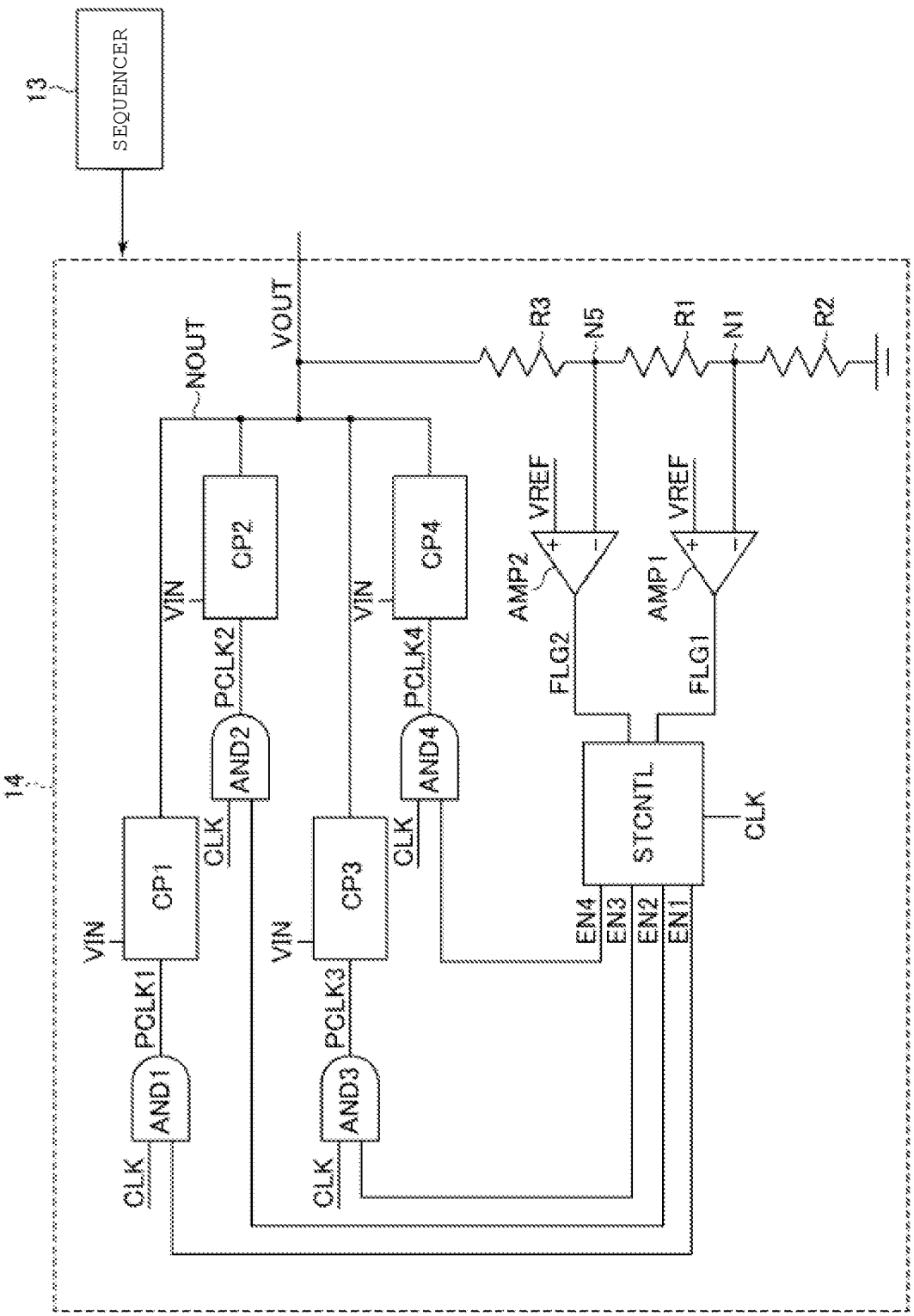
FIG. 10 is a circuit diagram illustrating an example of configurations of a voltage generation circuit and a sequencer according to a first modification example.

Configurations of the voltage generation circuit 14 and a sequencer 13 of the semiconductor memory device 1 according to the first modification example will be described with reference to FIG. 10. FIG. 10 is a circuit diagram illustrating an example of configurations of the voltage generation circuit and the sequencer according to the first modification example.

The voltage generation circuit 14 includes a resistor R3 and an operational amplifier AMP2 in addition to the configuration of the voltage generation circuit 14 according to the embodiment.

A first terminal of the resistor R3 is connected to a node NOUT. A second terminal of the resistor R3 is connected to a node N5.

A first terminal of the resistor R1 is connected to the node N5.

With the above configuration, the resistor R3 connects the first terminal of the resistor R1 to the node NOUT in series. Further, divided voltages of the voltage VOUT based on resistance values of the resistors R1, R2, and R3 are supplied to the nodes N1 and N5 as voltages VN1 and VN5, respectively.

The operational amplifier AMP2 has a non-inverting input terminal (+), an inverting input terminal (−), and an output terminal. A voltage VREF is applied to the non-inverting input terminal (+) of the operational amplifier AMP2. The inverting input terminal (−) of the operational amplifier AMP2 is connected to the node N5. The operational amplifier AMP2 generates a signal FLG2 based on a comparison result of the voltage VREF applied to the non-inverting input terminal (+) and the voltage VN5 of the node N5 applied to the inverting input terminal (−). In the first modification example, the voltage VREF is equal to the voltage VN5 when the voltage VOUT is equal to a voltage VTARG2. The voltage VTARG2 is less than a voltage VTARG1. Respective resistance values of the resistors R1 to R3 are set such that the voltage VN1 when the voltage VOUT is equal to the voltage VTARG1 is equal to the voltage VN5 when the voltage VOUT is equal to the voltage VTARG2. Thereby, the operational amplifier AMP2 generates a signal FLG2 of an "H" level when the voltage VN5 is less than the voltage VREF. In other words, when the voltage VOUT is lower than the voltage VTARG2, the signal FLG2 of an "H" level is generated. Further, the operational amplifier AMP2 generates the signal FLG2 of an "L" level when the voltage VN5 is higher than or equal to the voltage VREF. In other words, when the voltage VOUT is higher than or equal to the voltage VTARG2, the signal FLG2 of an "L" level is generated. The generated signal FLG2 is output from the output terminal of the operational amplifier AMP2 to the state control circuit STCNTL. The first modification example describes a case where the voltage VREF is applied to the non-inverting input terminal (+) of the operational amplifier AMP2, but a voltage different from the voltage VREF may be input to the non-inverting input terminal (+) of the operational amplifier AMP2. The voltage applied to the non-inverting input terminal (+) of the operational amplifier AMP2 is equal to the voltage VN5, for example, when the voltage VOUT is equal to a voltage VTARG3. Here, the voltage VTARG3 is different from the voltage VTARG2.

In addition to the signal FLG1, the signal FLG2 is input from the operational amplifier AMP2 to the state control circuit STCNTL. The state control circuit STCNTL controls the number Nu of signals EN at an "H" level among the signals EN1 to EN4 based on the signals FLG1 and FLG2.

2.1.2 Operation

Next, an operation will be described by using the semiconductor memory device 1 according to the first modification example.

In the following, an example is described in which the state control circuit STCNTL controls the number of charge pumps CP that are active during a charge period to be increased when a load current is increased during an operation of outputting the voltage VOUT.

State Transition Diagram

Figure 11:
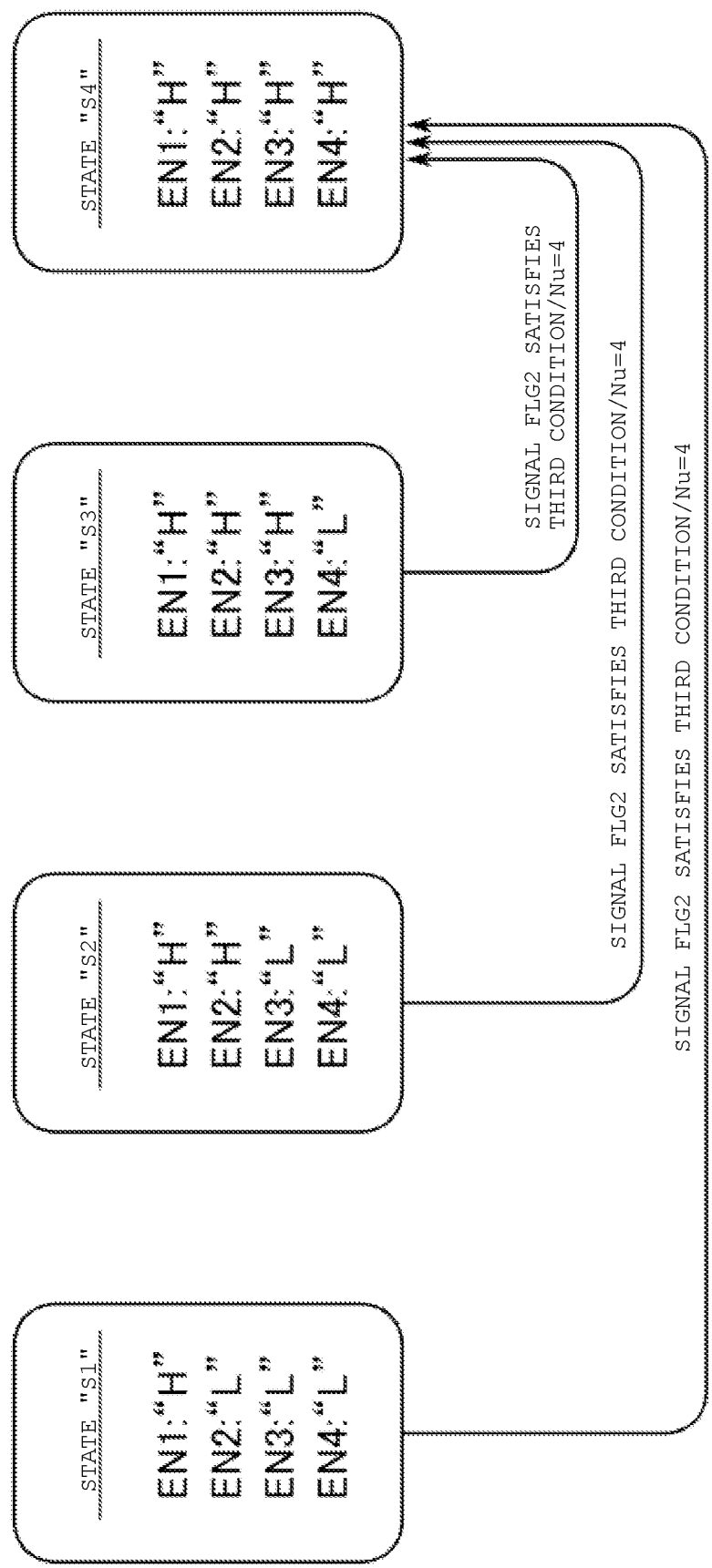
FIG. 11 is a state transition diagram illustrating an operation of the voltage generation circuit according to the first modification example.

A state transition of the voltage generation circuit 14 in an operation example of the first modification example will be described with reference to FIG. 11. FIG. 11 is a state transition diagram illustrating an operation of the voltage generation circuit in the first modification example. In the following, differences from the embodiment will be mainly described. In FIG. 11, a state transition of the voltage generation circuit 14 when the period $N_{LCLK}$ satisfies a first condition, and a state transition of the voltage generation circuit 14 when the period $N_{HCLK}$ satisfies a second condition are omitted.

In the operation example of the first modification example, the state control circuit STCNTL sets all signals EN to an "H" level when the signal FLG2 satisfies a third condition in the voltage generation circuit 14 having each of an "S1" state to an "S3" state. That is, the number Nu of signals EN at an "H" level is set to 4 (Nu=4). Thereby, the state control circuit STCNTL transitions a state of the voltage generation circuit 14 such that boost operations of all charge pumps CP are performed during a charge period (all charge pumps CP are active during the charge period).

More specifically, the state control circuit STCNTL determines whether the signal FLG2 is at an "H" level (whether the signal FLG2 satisfies the third condition). When determining that the signal FLG2 is at an "H" level based on a result of the determination, the state control circuit STCNTL sets all the signals EN to an "H" level.

Operations of the sequencer 13 and the voltage generation circuit 14 while the signal FLG 2 is at an "L" level is the same as the operations of the sequencer 13 and the voltage generation circuit 14 according to the embodiment.

Timing Chart

Figure 12:
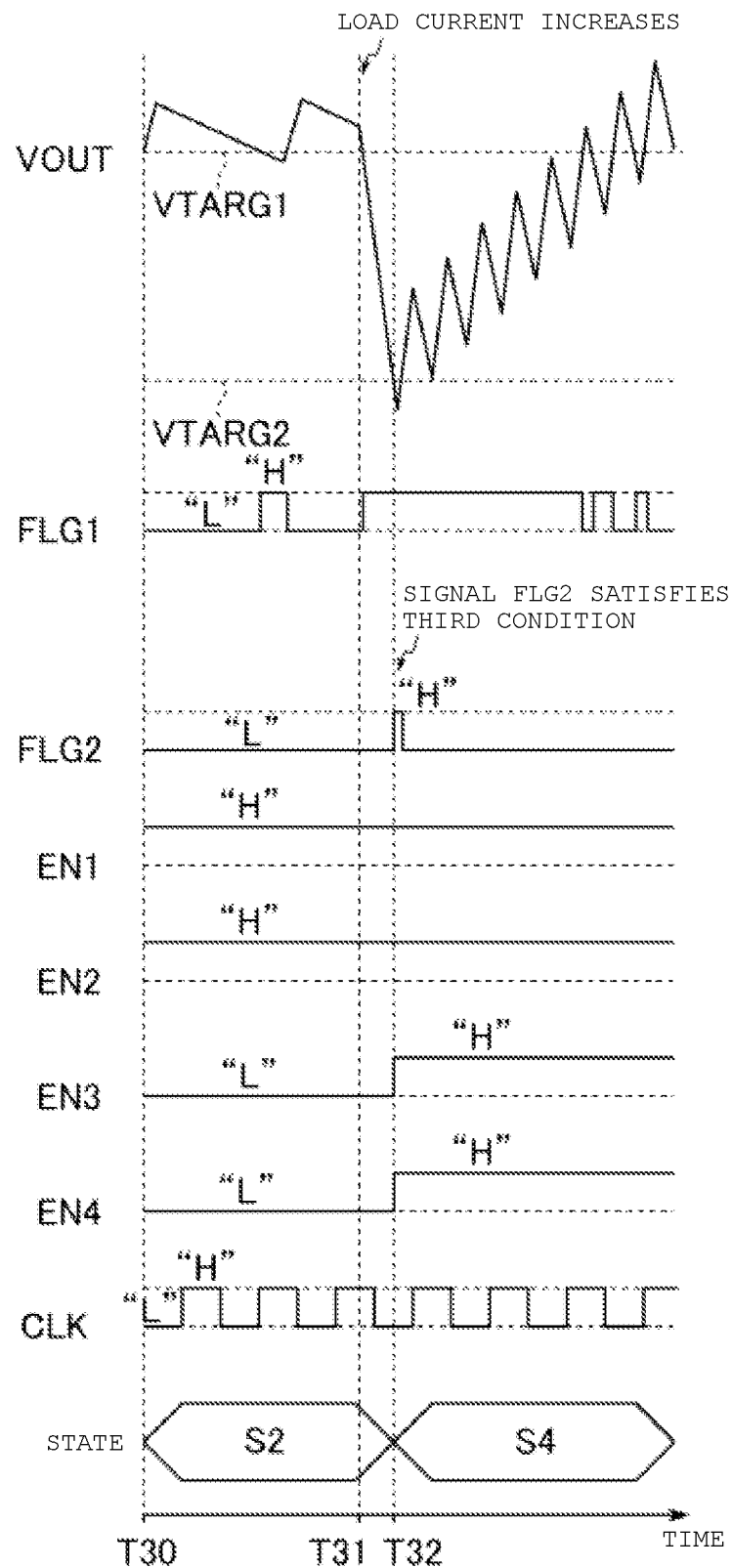
FIG. 12 is a timing chart illustrating the operation of the voltage generation circuit according to the first modification example.

An operation of the voltage generation circuit 14 in the operation example of the first modification example will be further described with reference to FIG. 12. FIG. 12 is a timing chart illustrating the operation of the voltage generation circuit in the first modification example. FIG. 12 illustrates the voltage VOUT, the signals FLG1, FLG2, and EN1 to EN4, the clock signal CLK, and a state of the voltage generation circuit 14.

In the following, an example of the operation of the voltage generation circuit 14 is illustrated in a case where the voltage VOUT decreases due to, for example, an increase in load current when the voltage generation circuit 14 outputs a voltage.

Hereinafter, an operation different from the operation according to at least one embodiment will be mainly described.

A state of the voltage generation circuit 14 at time T30 is an "S2" state. That is, the signals EN1 and EN2 are at an "H" level. Further, the signals EN3 and EN4 are at an "L" level.

Between the time T30 and time T31, periods $N_{LCLK}$ and $N_{HCLK}$ calculated by the state control circuit STCNTL are each less than twice the cycle of the clock signal CLK. Thereby, a boost operation of the voltage generation circuit 14 having the "S2" state during a charge period and a stop operation thereof during a discharge period are repeated in the same manner as the operation in at least one embodiment.

At the time T31, a load current of a load to which the voltage generation circuit 14 is connected increases. Thereby, the voltage VOUT begins to significantly decrease.

At time T32, the voltage VOUT is lower than a voltage VTARG2 due to an increase in the load current. Thereby, the signal FLG2 changes from an "L" level to an "H" level. Therefore, the state control circuit STCNTL determines that the signal FLG2 satisfies the third condition. Therefore, the state control circuit STCNTL sets all signals EN to an "H" level based on a result of the determination. Thereby, the state control circuit STCNTL transitions a state of the voltage generation circuit 14 from an "S2" state to an "S4" state. Along with this, all the charge pumps CP1 to CP4 become the charge pumps CP that are active during the charge period.

In periods after the time T32, the periods $N_{LCLK}$ and $N_{HCLK}$ calculated by the state control circuit STCNTL are each less than twice the cycle of the clock signal CLK. Thereby, a boost operation of the voltage generation circuit 14 having an "S4" state during a charge period and a boost operation thereof during a discharge period are repeated in the same manner as the operation in the embodiment.

As described above, the operation of the voltage generation circuit 14 is performed.

The voltage generation circuit 14 according to the first modification example also has the same effect as the voltage generation circuit according to the embodiment.

Further, according to the voltage generation circuit 14 of the first modification example, the voltage VOUT significantly decreases due to an increase in, for example, a load current, and thus, when the voltage VOUT is lower than the voltage VTARG2, an increase in period in which the voltage VOUT is less than the voltage VTARG1 can be prevented. That is, when the voltage VOUT is lower than the voltage VTARG2, all the charge pumps CP become the charge pumps CP that are active during the charge period, and thus, an increase of the voltage VOUT can be promoted.

2.2 Second Modification Example

In the above-described embodiment and the first modification example, an example is illustrated in which boost operations of the charge pumps CP that are active during a charge period are controlled by the sequencer 13, but the present disclosure is not limited thereto. The boost operations of the charge pumps CP may be controlled by a configuration of the voltage generation circuit 14.

A semiconductor memory device according to a second modification example will be described below. Hereinafter, a configuration of the semiconductor memory device according to the second modification example will be mainly described by focusing on differences from the configuration of the semiconductor memory device according to the embodiment. The operation according to the second modification example is substantially the same as the operation according to the embodiment, and thus, descriptions thereof are omitted.

Figure 13:
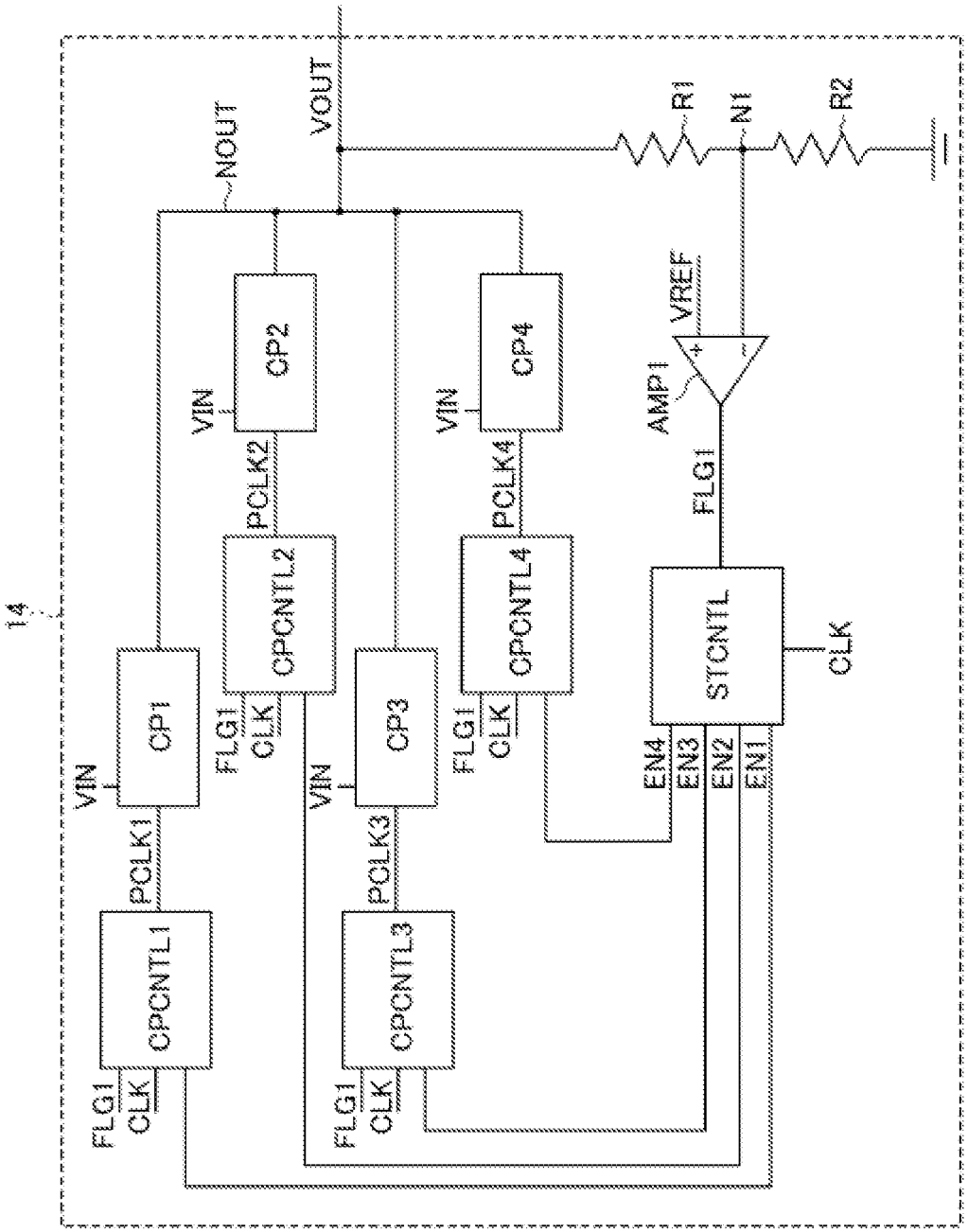
FIG. 13 is a circuit diagram illustrating an example of a configuration of a voltage generation circuit according to a second modification example.

A configuration of the voltage generation circuit 14 of the semiconductor memory device 1 according to the second modification example will be described with reference to FIG. 13. FIG. 13 is a circuit diagram illustrating an example of the configuration of the voltage generation circuit according to the second modification example.

The voltage generation circuit 14 includes pump control circuits CPCNTL1, CPCNTL2, CPCNTL3, and CPCNTL4 instead of, for example, the logical product circuits AND1, AND2, AND3, and AND4. In the following description, when the pump control circuits CPCNTL1 to CPCNTL4 are not distinguished from each other, each of the pump control circuits CPCNTL1 to CPCNTL4 is simply referred to as a pump control circuit CPCNTL.

In the second modification example, a boost operation of the charge pump CP to which a signal PCLK is input is performed while a clock signal is input to each charge pump CP as a signal PCLK.

The signal FLG1 is input from the operational amplifier AMP1 to the pump control circuit CPCNTL1. Further, the clock signal CLK is input to the pump control circuit CPCNTL1. Further, the signal EN1 is input to the pump control circuit CPCNTL1. The pump control circuit CPCNTL1 generates the signal PCLK1 based on the signals FLG1 and EN1 and the clock signal CLK. Then, the generated signal PCLK1 is output to the charge pump CP1.

More specifically, when detecting that the signal FLG1 is at an "H" level, the pump control circuit CPCNTL1 generates the signal PCLK1 having the same frequency as the clock signal CLK while the signal EN1 is at an "H" level during a charge period. Thereby, the charge pump CP1 becomes an active charge pump CP.

The signal FLG1 is input from the operational amplifier AMP1 to the pump control circuit CPCNTL2. Further, the clock signal CLK is input to the pump control circuit CPCNTL2. Further, the signal EN2 is input to the pump control circuit CPCNTL2. The pump control circuit CPCNTL2 generates the signal PCLK2 based on the signals FLG1 and EN2 and the clock signal CLK. Then, the generated signal PCLK2 is output to the charge pump CP2.

More specifically, when detecting that the signal FLG1 is at an "H" level, the pump control circuit CPCNTL2 generates the signal PCLK2 having the same frequency as the clock signal CLK while the signal EN2 is at an "H" level during the charge period. Thereby, the charge pump CP2 becomes an active charge pump CP. When the signal EN2 is at an "L" level during the charge period, the pump control circuit CPCNTL2 generates the signal PCLK2 of an "L" level. Thereby, the charge pump CP2 becomes an inactive charge pump CP.

The signal FLG1 is input from the operational amplifier AMP1 to the pump control circuit CPCNTL3. Further, the clock signal CLK is input to the pump control circuit CPCNTL3. Further, the signal EN3 is input to the pump control circuit CPCNTL3. The pump control circuit CPCNTL3 generates the signal PCLK3 based on the signals FLG1 and EN3 and the clock signal CLK. Then, the generated signal PCLK3 is output to the charge pump CP3.

More specifically, when detecting that the signal FLG1 is at an "H" level, the pump control circuit CPCNTL3 generates the signal PCLK3 having the same frequency as the clock signal CLK while the signal EN3 is at an "H" level during the charge period. Thereby, the charge pump CP3 becomes an active charge pump CP. When the signal EN3 is at an "L" level during the charge period, the pump control circuit CPCNTL3 generates the signal PCLK3 of an "L" level. Thereby, the charge pump CP3 becomes an inactive charge pump CP.

The signal FLG1 is input from the operational amplifier AMP1 to the pump control circuit CPCNTL4. Further, the clock signal CLK is input to the pump control circuit CPCNTL4. Further, the signal EN4 is input to the pump control circuit CPCNTL4. The pump control circuit CPCNTL4 generates the signal PCLK4 based on the signals FLG1 and EN4 and the clock signal CLK. Then, the generated signal PCLK4 is output to the charge pump CP4.

More specifically, when detecting that the signal FLG1 is at an "H" level, the pump control circuit CPCNTL4 generates the signal PCLK4 having the same frequency as the clock signal CLK while the signal EN4 is at an "H" level during the charge period. Thereby, the charge pump CP4 becomes an active charge pump CP. When the signal EN4 is at an "L" level during the charge period, the pump control circuit CPCNTL4 generates the signal PCLK4 of an "L" level. Thereby, the charge pump CP4 becomes an inactive charge pump CP.

As described above, in the second modification example, a boost operation of the charge pump CP is controlled by the pump control circuit CPCNTL in the voltage generation circuit 14.

The second modification example illustrates a case in which the boost operation of each charge pump CP is controlled by the pump control circuit CPCNTL corresponding to the charge pump CP, but the present disclosure is not limited thereto. The boost operation of each charge pump CP may be controlled by, for example, a logical product circuit corresponding to the charge pump CP, instead of the pump control circuit CPCNTL.

More specifically, the signal FLG1 is input from the operational amplifier AMP1 to a logical product circuit corresponding to each charge pump CP. Further, the clock signal CLK is input to the logical product circuit. Further, the signal EN is input to the logical product circuit. The logical product circuit AND generates the signal PCLK based on the signals FLG1 and EN and the clock signal CLK. Then, the generated signal PCLK is output to the charge pump CP.

The voltage generation circuit 14 according to the second modification example also has the same effect as the voltage generation circuit according to the embodiment.

3. Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A voltage generation circuit comprising:
a plurality of charge pumps each connected to a first node;
a control circuit configured to control a number of active charge pumps among the plurality of charge pumps based on a period in which a voltage of the first node satisfies a predetermined condition; and
wherein the control circuit is configured to reduce the number of active charge pumps based on a first period in which the voltage of the first node is at least a first voltage in a state where at least two charge pumps among the plurality of charge pumps are active.

2. The voltage generation circuit according to claim 1, wherein the control circuit is configured to increase a number of inactive charge pumps among the plurality of charge pumps based on a second period in which the voltage of the first node is maintained to be less than the first voltage in a state where at least one charge pump among the plurality of charge pumps is inactive.

3. The voltage generation circuit according to claim 2, wherein the first period and the second period are periods based on a clock signal.

4. The voltage generation circuit according to claim 2, wherein the control circuit is configured to control all of the plurality of charge pumps to be active charge pumps when the voltage of the first node is less than a second voltage, the second voltage being less than the first voltage.

5. The voltage generation circuit according to claim 4, further comprising:
   a first resistor having a first terminal and a second terminal, the first terminal connected to the first node, the second terminal connected to a second node;
   a second resistor having a first terminal connected to the second node; and
   a first operational amplifier having a first terminal and a second terminal, the first terminal connected to the second node, the second terminal having a third voltage applied thereto, the first operational amplifier configured to output a first comparison result of a voltage of the second node and the third voltage to the control circuit,
   wherein the first period and the second period are periods based on the first comparison result.

6. The voltage generation circuit according to claim 5, wherein the third voltage is the voltage of the second node when the voltage of the first node is equal to the first voltage.

7. The voltage generation circuit according to claim 5, further comprising:
   a third resistor arranged to connect the first node to the first resistor in series, the third resistor having a first terminal connected to the first node and a second terminal connected to the third node together with the first terminal of the first resistor; and
   a second operational amplifier having a first terminal and a second terminal, the first terminal connected to the third node and the second terminal, the second terminal having a fourth voltage applied thereto, the second operational amplifier configured to output a second comparison result of a voltage of the third node and the fourth voltage to the control circuit,
   wherein the voltage generation circuit is configured to determine whether the voltage of the first node is less than the second voltage based on the second comparison result.

8. The voltage generation circuit according to claim 7, wherein the fourth voltage is the voltage of the third node when the voltage of the third node is equal to the second voltage.

9. The voltage generation circuit according to claim 8, wherein the third voltage is equal to the fourth voltage.

10. The voltage generation circuit according to claim 1, wherein, when the voltage of the first node is less than the first voltage, the control circuit starts to generate a voltage by using the active charge pumps among the plurality of charge pumps.

11. The voltage generation circuit according to claim 10, wherein the control circuit is configured to generate a voltage by using the active charge pumps among the plurality of charge pumps during a third period, and to stop the generation of the voltage by using the active charge pumps among the plurality of charge pumps during a fourth period after the third period ends.

12. A semiconductor memory device comprising:
   the voltage generation circuit according to claim 1; and
   a memory cell,
   wherein the semiconductor memory device is configured to supply the voltage of the first node to the memory cell.

13. The semiconductor memory device according to claim 12,
   wherein: when the voltage of the first node is less than the first voltage, the control circuit causes boost operations of the active charge pumps among the plurality of charge pumps to be started.

14. The semiconductor memory device according to claim 13, wherein the control circuit is configured to generate a voltage by using the active charge pumps among the plurality of charge pumps during the first period, and stop the generation of the voltage using the active charge pumps among the plurality of charge pumps during a second period after the first period ends.

* * * * *